United States Patent [19]
Yamazaki et al.

[11] Patent Number: 5,946,561
[45] Date of Patent: Aug. 31, 1999

[54] SEMICONDUCTOR DEVICE AND METHOD FOR FORMING THE SAME

[75] Inventors: Shunpei Yamazaki, Tokyo; Hongyong Zhang; Yasuhiko Takemura, both of Kanagawa, all of Japan

[73] Assignee: Semiconductor Energy Laboratory Co., Ltd., Kanagawa, Japan

[21] Appl. No.: 08/757,616

[22] Filed: Nov. 29, 1996

Related U.S. Application Data

[63] Continuation of application No. 08/085,931, Jul. 6, 1993, abandoned, which is a continuation of application No. 07/853,690, Mar. 17, 1992, Pat. No. 5,313,076.

[30] Foreign Application Priority Data

| Jul. 6, 1992 | [JP] | Japan | .................................. 4-201932 |
| Jul. 24, 1992 | [JP] | Japan | .................................. 4-218324 |
| Feb. 10, 1993 | [JP] | Japan | .................................. 5-045786 |

[51] Int. Cl.$^6$ .................................................. H01L 21/84
[52] U.S. Cl. ............................................. 438/166; 438/308
[58] Field of Search .................................. 438/166, 308, 438/981

[56] References Cited

U.S. PATENT DOCUMENTS

| 4,415,383 | 11/1983 | Naem et al. . |
| 4,431,459 | 2/1984 | Teng . |
| 4,523,962 | 6/1985 | Nishimura . |
| 4,727,044 | 2/1988 | Yamazaki ................................. 437/45 |
| 4,813,292 | 3/1989 | Sasaki et al. ............................ 437/101 |
| 4,851,363 | 7/1989 | Troxel et al. . |
| 4,959,700 | 9/1990 | Yamazaki . |
| 5,077,235 | 12/1991 | Kosaka ..................................... 437/72 |
| 5,142,344 | 8/1992 | Yamazaki . |
| 5,298,434 | 3/1994 | Strater et al. ............................. 437/21 |
| 5,306,651 | 4/1994 | Masumo et al. .......................... 437/40 |
| 5,313,076 | 5/1994 | Yamazaki et al. ....................... 257/66 |

FOREIGN PATENT DOCUMENTS

| 0178447 | 4/1986 | European Pat. Off. ............... 437/173 |
| 0023429 | 5/1982 | Japan ..................................... 437/978 |
| 59-121876 | 7/1984 | Japan . |
| 60-245174 | 12/1985 | Japan . |
| 1-187983 | 7/1989 | Japan . |
| 5-206468 | 8/1993 | Japan . |
| 6-059280 | 3/1994 | Japan . |

OTHER PUBLICATIONS

Sameshima et al., Japanese Journal of Applied Physics, "XeCl Excimer Laser Annealing used to Fabricate Poly–Si: TFT's", vol. 28, No. 10, Oct. 1989, pp. 1789–1793.
Sera et al., "High Performance TFT's Fabricated by XeCl Excimer Laser Annealing of Hydrogenated Amorphous Silicon Film", IEEE Transactions, 36 (1989), pp. 2868–2872.
Kiang et al., "Modification of S/C Device Char. by Lasers", IBM, 1982 pp. 171–176.
Sameshima et al., "XeCl Excimer Laser Annealing used to Fabricate poly–Si TFT's", Mat. Res Soc. Symp Proc. vol. 71, 1986, pp. 435–440.
Iwamatsu et al., "Silicon on Saaphire MOSFETs Fabricated by back Surface Laser Anneal Technology", Electronics Letters, vol. 15, #25, pp. 827–828, Dec. 1979.

*Primary Examiner*—Richard A Booth
*Attorney, Agent, or Firm*—Sixbey, Friedman, Leedom & Ferguson, P.C.; Gerald J. Ferguson, Jr.; Jeffrey L. Costellia

[57] ABSTRACT

Thin-film semiconductor devices such as TFTs (thin-film transistors) and methods of fabricating the same. TFTs are formed on an insulating substrate. First, a substantially amorphous semiconductor coating is formed on the substrate. A protective coating transparent to laser radiation is formed on the semiconductor coating. The laminate is irradiated with laser radiation to improve the crystallinity of the semiconductor coating. Then, the protective coating is removed to expose the surface of the semiconductor coating. A coating for forming a gate-insulating film is formed. Subsequently, gate electrodes are formed. Another method relates to fabrication of semiconductor devices such as TFTs on an insulating substrate. After forming a first coating consisting mainly of aluminum nitride, a second coating consisting principally of silicon oxide is formed. Semiconductor devices such as TFTs or semiconductor circuits are built on the second coating serving as a base layer.

9 Claims, 16 Drawing Sheets

SEMICONDUCTOR DEVICE AND METHOD FOR FORMING THE SAME

This application is a continuation of Ser. No. 08/085,931, filed Jul. 6, 1993, now abandoned, which is a continuation of Ser. No. 07/853,690, filed on Mar. 17, 1992, now U.S. Pat. No. 5,313,076.

BACKGROUND OF THE INVENTION

1. Field of the Invention

The present invention relates to a low-temperature process for fabricating an insulated gate semiconductor device at a temperature as low as 450° C. or even lower, and to a process for fabricating, at good yield, an integrated circuit (IC) comprising said devices at a high degree of integration. The present invention also relates to a semiconductor device having fabricated by the above process. It further relates to a highly reliable semiconductor device. The semiconductor devices according to the present invention are suited for use in, for example, active matrix-driven liquid crystal displays, driver circuits of image sensors, etc., as well as thin film transistors for SOI integrated circuits and for conventional semiconductor integrated circuits (e.g., microprocessors, microcontrollers, microcomputers, semiconductor memories, etc.).

2. Prior Art

Recently, much effort is paid on the study of fabricating insulated gate semiconductor devices on insulator substrates (MOSFETs). Such devices comprising semiconductor integrated circuits on insulator substrates are advantageous for driving circuits at high speed. In contrast to the conventional semiconductor ICs whose speed is limited by the presence of a stray capacitance attributed principally to the capacitance between the connection and the substrate, the new type of semiconductor integrated circuits do not suffer such stray capacitance. The above MOSFET having a thin film active layer on an insulator substrate is denoted as a thin film transistor (TFT). The TFT can be found also in the conventional semiconductor ICs as, for example, a load transistor for SRAMs.

More recently, there is a demand for fabricating semiconductor ICs on a light-transmitting substrate, for example, as driver circuits in optical devices such as liquid crystal displays and image sensors. TFTs are also useful in such application fields. The circuits for use therein should, however, be formed over a large area. The process is therefore required to be conducted at a ever lower temperature. Furthermore, for example, when there is a need of connecting a semiconductor IC to the terminals of a device having a plurality of terminals on an insulator substrate, it is proposed to form monolithically the entire semiconductor IC or to form at least the initial stages thereof monolithically on the same insulator substrate.

Conventionally, TFTs have been fabricated by annealing an amorphous, a semi-amorphous, or a microcrystalline semiconductor film in the temperature range of from 450 to 1,200° C. to obtain a crystalline film having an improved crystallinity and having a sufficiently high mobility. TFTs include amorphous TFTs using an amorphous material as the semiconductor film, however, such TFTs are not useful as they are because they yield a mobility as low as 5 cm$^2$/Vs or even lower, and in general, the mobility falls to a value of about 1 cm$^2$/Vs or lower. The use of amorphous TFTs as they are is confined to a narrow range of application because of its low operation speed and its limited applicability to N-channel type TFTs. Accordingly, these TFTs were annealed in the aforementioned temperature range to attain a mobility of 5 cm$^2$/Vs or higher. Only after annealing, these TFTs can provide P-channel TFTs (PTFTs).

A thermal process as described in the foregoing has, however, strict limitations on the material to be used as the substrate. In a so-called high temperature process which comprises a step of heating to a temperature in the range of from 900 to 1,200° C. at maximum, a thermally oxidized film of superior quality can be used as the gate dielectric. Thus, expensive substrates such as those made of quartz and sapphire and spinel were the only candidates applicable to such high temperature processes. Moreover, large area substrates were rarely obtained with such expensive materials.

In contrast to the case of a high-temperature process, variety of substrate materials can be selected for use in a low temperature process which is conducted at temperatures which do not exceed the range of from 450 to 750° C. However, a low temperature process requires annealing for a long time, and the substrates resulting therefrom suffer strain and shrinking due to the heat effect.

Furthermore, it is extremely difficult in a MISFET, i.e., an insulated gate semiconductor device having formed on an insulated surface established by incorporating a thick insulator film between a semiconductor substrate and the device to isolate the device from the semiconductor substrate, to obtain an element having favorable crystallinity as in the case using a single crystal semiconductor. Accordingly, a non-single crystalline semiconductor, i.e., a crystalline semiconductor other than a single crystal semiconductor, had been used generally in MISFETS.

The non-single crystalline semiconductors comprise defects at high density, and are usually neutralized previously with an element such as hydrogen to use them in a practically defect-free state. The neutralization process can be carried out by, for example, hydrogenation. The bond between hydrogen and the semiconductor element such as silicon is generally weak, and would easily undergo breakage to cause decomposition of the resulting compound on applying a thermal energy corresponding to a mere several tens of degrees Centigrade. Accordingly, when electric voltage or current is applied for a long duration of time, hydrogen readily undergoes desorption due to the local heat up of the semiconductor. This phenomena remarkably causes degradation of the semiconductor.

The present invention has been achieved in the light of the aforementioned circumstances. An object of the present invention is, therefore, to provide a process which can be conducted at a temperature not higher than 450° C., which suffer no limitations on the substrate material, and which has no problems of strain and shrinkage. Another object of the present invention is to provide a semiconductor device having such a structure that the heat generated during its usage can be rapidly released, and also to a process for fabricating the device.

SUMMARY OF THE INVENTION

A first embodiment of the present invention provides a thin film semiconductor device comprising a substrate having provided thereon a film comprising aluminum nitride as the principal component, having directly or indirectly formed thereon a semiconductor film comprising silicon as the principal component, and having further established directly or indirectly thereon a wiring made of a material such as a metal and a semiconductor.

The present invention also provides a process for fabricating a thin film semiconductor device having the above structure. Accordingly, a second embodiment of the present invention provides a process which comprises forming a film containing aluminum nitride as the principal component, forming thereon either directly or indirectly a semiconductor film comprising silicon as the principal component, and further establishing thereon either directly or indirectly a wiring made of a material such as a metal and a semiconductor.

Aluminum nitride is a superior conductor of heat and is suited for applications in which light transmitting properties are required, because it has an optical gap of 6.2 eV and is thereby transparent to visible light and near ultraviolet light. The aluminum nitride film is formed by deposition processes such as sputtering, reactive sputtering, and MOCVD (metal-organic chemical vapor deposition). In obtaining an aluminum nitride film by a reactive sputtering process, the process is preferably conducted under nitrogen gas atmosphere using an aluminum target. For achieving sufficient heat emission with the aluminum nitride film in accordance with the object of the present invention, the aluminum nitride film is preferably deposited at a thickness of from 100 to 5,000 Å. An aluminum nitride film 5,000 Å or more in thickness was not practically feasible because the deposited film could be easily peeled off.

The thus obtained aluminum nitride film exerts a blocking effect against mobile ions such as sodium. Accordingly, the film protects the semiconductor device against the intrusion of such mobile ions.

The aluminum nitride film need not contain nitrogen and aluminum at a stoichiometric ratio so long as the thermal conductivity of the film is not impaired. Typically, a preferred aluminum to nitrogen ratio (aluminum/nitrogen) is in the range of 0.9 to 1.4, and the thermal conductivity of the film is preferably 0.6 W/cm.K or higher. This value can be contrasted to 2 W/cm.K for single crystal aluminum nitride.

The tension of the film may be controlled optimally by changing the compositional ratio of nitrogen and aluminum. Otherwise, a trace amount of boron, silicon, carbon, oxygen, etc., may be incorporated to optimally control the strain. The film containing aluminum nitride as the principal component may be either crystalline or amorphous.

In general, a high thermal conductivity can be achieved by incorporating a diamond material such as a thin film of polycrystalline diamond, a hard carbon film, or a diamond-like carbon film. When a small area as the one in the device according to the present invention is considered, however, a satisfactory effect cannot be obtained because a tight adhesion cannot be obtained between a diamond material and a silicon oxide material. A silicon nitride film which is frequently used in a semiconductor process as a blocking layer and a passivation layer is not suited in that the thermal conductivity thereof is low. The characteristics of the well known materials for thin films were evaluated, and the results are summarized below for comparison.

|  | $AlN^{1)}$ | $DLC^{2)}$ | $SnO_2^{3)}$ | $SiN_x^{4)}$ |
|---|---|---|---|---|
| Adhesibility[5] | ○ | Δ | ○ | ○ |
| Light transmittance | ○ | Δ | ○ | ○ |
| Mechanical strength | ○ | ○ | Δ | ○ |
| Thermal conductivity | ○ | ○ | ○ | Δ or X |

-continued

|  | $AlN^{1)}$ | $DLC^{2)}$ | $SnO_2^{3)}$ | $SiN_x^{4)}$ |
|---|---|---|---|---|
| Heat resistance | ○ | Δ | Δ | ○ |
| Sodium blocking effect | ○ | Δ | Δ | ○ |

Note:
 1) AlN: Aluminum nitride,
 2) DLC: Diamond-like carbon,
 3) $SnO_2$: Tin oxide, and
 4) SiNx: Silicon nitride.
 5) "Adhesibility" signifies adhesibility to silicon oxide.
 The symbols o, Δ, and x in the evaluation represent "good," "fair," and "poor," respectively.

In the device according to the present invention, the heat having generated from the metallic or semiconductor wiring (e.g., gate wiring, etc.) is transferred to the underlying semiconductor films (e.g., active layers, etc.), and the semiconductor films themselves generate heat by the electric current applied thereto. Accordingly, the semiconductor films are heated to a higher temperature, but the heat is rapidly transferred to an aluminum nitride film provided under the semiconductor film to prevent heat accumulation from occurring on the semiconductor film. In this manner, the temperature of the wiring and the semiconductor film can be suppressed to avoid hydrogen desorption.

It is not preferred in the present invention to deposit the semiconductor film directly on the aluminum nitride film. If the semiconductor film were to be deposited directly on an aluminum nitride, not only the adhesion results are insufficient, but also an unfavorable influence is cast on the electric properties of the semiconductor film. Accordingly, it is preferable to provide, between the semiconductor film and the aluminum nitride film, a material effective for stress relaxation and yet having favorable electric and chemical properties.

Alternatively, a silicon nitride film may be formed with an aluminum nitride film thereon, and a silicon oxide film may be further formed thereon. In the device according to the present invention, the gate contact may be made from single elements such as silicon (inclusive of an impurity-doped one having an improved conductivity), aluminum, tantalum, chromium, tungsten, and molybdenum, or from an alloy or a multilayered film thereof. Furthermore, the surface thereof may be oxidized as described in the Examples referred hereinafter.

Aluminum nitride may be used positively as an etching stopper, because it would not be etched by any etching method commonly used for etching silicon oxide, silicon, aluminum, etc., in an ordinary fabrication process for semiconductor devices.

The process according to the present invention is also characterized by that the crystallinity of the semiconductor film is ameliorated not by a conventional process in thermal equilibrium, but by the irradiation of an intense light such as a pulsed laser beam or an intense light equivalent thereto. By employing this method, it can be seen that the maximum temperature of the process depends on the temperature of the step other than the annealing of the semiconductor film, that is, on the steps such as the hydrogenation annealing and the annealing of gate dielectric. Accordingly, the substrate for use in the device according to the present invention can be selected from a wider range of materials. More specifically, a soda-lime glass or an alkali-free glass (e.g., #7059 glass from Corning Incorporated), which were regarded conventionally unapplicable to substrates for operating TFTs thereon due to the low softening point thereof, can be used for driving TFTs after applying a pertinent treatment to the glass.

The process according to the present invention comprises forming a semiconductor film on an insulator substrate; forming a film capable of transmitting a laser beam or an intense light equivalent to the laser beam on said semiconductor film; irradiating a pulsed laser beam or an intense light equivalent to the laser beam to said layered film to thereby improve the crystallinity of the semiconductor film; removing said film capable of transmitting the laser beam or the intense light to expose a surface of the semiconductor film; forming a gate insulating film on said semiconductor film; forming a wiring or a gate contact on said gate insulating film; introducing impurities into said semiconductor film in a self-aligned manner with the wiring or the gate contact as a mask by processes such as ion irradiation and ion implantation and ion doping; and irradiating a pulsed laser beam or an intense light equivalent thereto to said semiconductor film with the wiring or the gate contact as a mask after the introducing step to thereby recover the crystallinity of the semiconductor film which was once destroyed in the step of introducing the impurity elements. The last two steps may be replaced by laser doping process disclosed in the application of the present inventors (see, for example, Japanese Patent Application No. Hei-4-100479). In the present invention, metallic materials having low resistivity, such as aluminum, are preferred for use as the materials for gate contact and connection. The pulsed laser beam for use in the present invention is generated preferably from ultraviolet-light emitting lasers such as excimer lasers using KrF, ArF, XeCl, and XeF gases. Preferably, an insulator film of a material selected from silicon nitride, aluminum oxide, and aluminum nitride, or a layered film composed of the same with silicon oxide film is provided between said insulator substrate and said semiconductor film. The silicon oxide film is provided at a thickness of from 300 to 3,000 Å, and more preferably, at a thickness of from 500 to 1,500 Å. The insulator film of a material selected from silicon nitride, aluminum oxide, and aluminum nitride is provided at a thickness of from 300 to 3,000 Å, and preferably, at a thickness of from 1,000 to 2,000 Å. Otherwise, a halogen infrared light-emitting lamp may be used for irradiating an intense light. An intense light (or a pulsed light) equivalent to a laser beam signifies an optical energy or a combination thereof with an auxiliary thermal energy, which is applied for a sufficiently short period of time, in general, for a duration of within 5 minutes, to the semiconductor film for recovering the crystallinity thereof.

The present invention is characterized by that after removing the previously established protective layer used for irradiation of a laser beam or an intense light equivalent thereto to the active layer to recover the crystallinity of the active layer, a film other than the protective layer may be used as the gate insulating film. This step considerably improves the characteristics of the resulting TFT. The reason for the improvement in the characteristics of a TFT is believed as follows. In the crystallization from an amorphous state, a considerable amount of non-stoichiometric compounds are often found to develop at the interface, and particularly, silicon-rich silicon oxide tend to form at the vicinity of the interface. Those non-stoichiometric compounds, however, function insufficiently either as insulators or semiconductors. It can be seen accordingly that the presence of non-stoichiometric silicon oxide hinders the achievement of preferred characteristics since it is well established that the interface plays an important role in an insulated gate element.

If a laser beam or an intense light equivalent thereto is irradiated directly onto the film without using any protective film, however, an irregular surface is developed thereon. Such an uneven surface as a consequence provides an element having poor characteristics. The step of removing the once provided protective layer corresponds to the removal of the aforementioned non-stoichiometric silicon oxide to give pure silicon with favorable crystallinity. In particular, it is found that favorable results can be obtained by removing the protective layer by wet etching using hydrofluoric acid and the like. A dry etching process causes damage to the silicon film, but wet etching provides an extremely stable surface by terminating the dangling bonds with fluorine and hydrogen before double bonds are formed among the silicon atoms.

In the present invention, the depth of the region which form upon annealing with a laser beam or an intense light equivalent thereto can be set and controlled freely as desired according to the invention of the present inventors as disclosed in Japanese Patent Application No. Hei-3-50793. In this manner, a structure comprising a double-layered active layer can be obtained to reduce the leak current between the source and the drain.

The annealing process using a laser beam or an infrared (IR) light from an IR lamp according to the present invention is preferably conducted while heating additionally the substrate to a temperature of from 100 to 500° C., and representatively, to 300 to 400° C. In this manner, a film with improved homogeneity can be obtained.

A first example for the application according to the present invention provides a peripheral circuit for an active-matrix (AM) driven liquid crystal display (LCD) device using an amorphous silicon (a-Si) TFT. The a-Si TFT-AMLCD can be obtained by establishing an a-Si TFT generally at a temperature range of 400° C. or lower on a substrate made from an alkali-free glass such as Corning #7059 glass (produced by Corning Incorporated). An a-Si TFT has a high OFF resistance and is thereby best suited for a switching element, however, as mentioned earlier, it cannot provide a CMOS and it suffers a low operation speed. Accordingly, the peripheral driver circuit is generally established with a single crystal IC and the terminals of the matrix are connected to the terminals of the IC by methods such as tape-automated bonding (TAB). However, this type of mounting confronts more difficulty in reducing size of the pixels, and thereby the cost for mounting increases as to account for a larger percentage of the module cost.

It had been difficult by the conventional process to establish the peripheral circuit on the same substrate for the matrix due to thermal constraints. In the present invention, however, a TFT having a larger mobility can be established at a temperature equivalent to that at which a conventional a-Si TFT has been formed.

A second example for the application of the present invention comprises forming a TFT on a material such as soda-lime glass, i.e., a glass further reduced in cost as compared with an alkali-free glass. In this case, preferably, an insulator coating is first applied to the glass to avoid direct contact of the TFT with the soda-lime glass, because the mobile ions such as sodium ions intrude from the glass into the TFT. The insulator coating may be such containing silicon nitride, aluminum oxide, or aluminum nitride as the principal component. Then, a base insulator film made from silicon oxide and the like is formed on the resulting insulator coating, and the process according to the present invention is applied to establish a TFT. Furthermore, failure of the device can be avoided by preferentially using PTFTs over NTFTs as the matrix TFTs. When mobile ions intrude into an NTFT from the substrate, a channel is always formed to realize an ON state on the NTFT. However, a PTFT would not suffer formation of a channel in such a case.

A third example for the application of the present invention comprises a peripheral circuit of a liquid crystal display (LCD) of a direct multiplexing drive type, i.e., a static simple-matrix driven LCD. A ferroelectric liquid crystal (FLC), for instance, has a memory function, and it thereby provides a display of high contrast even when it is simple-matrix driven. Conventionally, however, the peripheral circuit therefor has been established in the same manner as in the a-Si TFT AMLCDs by connecting the ICs by a TAB process and the like. Similarly, the peripheral circuit for a static operation LCD which takes advantage of the phase transition from a cholesteric phase to a nematic phase has been conventionally established by TAB connection. A static drive LCD which comprises a combination of a nematic liquid crystal and a ferroelectric polymer is proposed in JP-A-61-1152 (the term "JP-A-" as referred herein signifies "an unexamined published Japanese patent application"), however, this also comprises a TAB-connected peripheral circuit.

All of the LCDs enumerated above are of direct multiplexing drive and they therefore provide a large area display with high precision using a low cost substrate. A fine display can be obtained by reducing the pitch between the terminals, but only at the expense of making the IC mounting difficult. It can be seen, accordingly, that the present invention provides monolithically a peripheral circuit using a low cost substrate and yet free from concerns on the problem of heat.

A fourth example for the application of the present invention provides a so-called three-dimensional IC which comprises forming TFTs on semiconductor ICs having established thereon metallic connections. Still other and a variety of applications are available taking advantage of the present invention.

DETAILED DESCRIPTION OF THE INVENTION

The present invention is illustrated in greater detail referring to a non-limiting example below. It should be understood, however, that the present invention is not to be construed as being limited thereto.

EXAMPLE 1

A peripheral circuit for an active matrix (AM)-driven liquid crystal device (LCD) using a-Si TFT was established according to the present invention. As mentioned in the foregoing, conventional AMLCDs based on a-Si TFTs had been fabricated by TAB connection because it was not possible to form the peripheral circuit monolithically with the matrix. However, a TAB process is costly due to the high cost of connection which is necessary in addition to the cost of the ICs. The total cost of the ICs and the connection amounted to account for 20% or more of the cost for the entire panel module. A low cost panel module was realized according to the present invention, by establishing the matrix and the peripheral circuit monolithically on a single glass substrate.

First, a silicon oxide film 102 as a base oxide film was formed to a thickness of from 100 to 300 nm on a Corning #7059 glass substrate 101 (either 300 mm×300 mm or 100 mm×100 mm in area) by sputtering in an oxygen atmosphere or by decomposing TEOS and depositing silicon oxide by plasma CVD, which was followed by annealing in the temperature range of from 450 to 650° C.

Figure 1A:
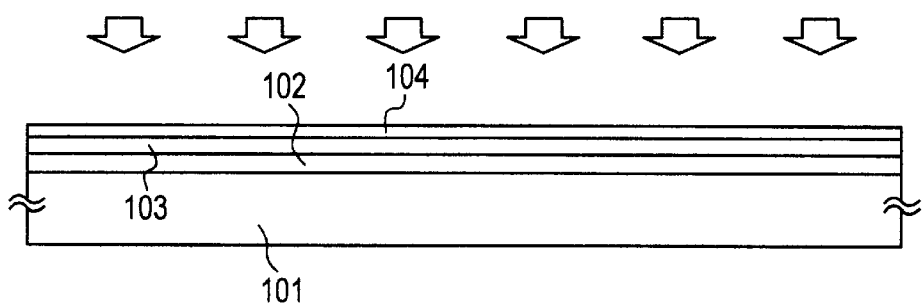
FIG. 1, (A)–(E), are cross-sectional views of a TFT, for illustrating steps successively performed to fabricate the TFT according to the invention.

Then, an amorphous silicon film 103 was deposited by plasma CVD or LPCVD at a thickness of from 30 to 150 nm, preferably from 50 to 100 nm, and a silicon oxide or a silicon nitride film was deposited thereon as a protective layer 104 at a thickness of from 20 to 100 nm, preferably, at a thickness of from 50 to 70 nm. A KrF excimer laser pulse being operated at a wavelength of 248 nm and at a pulse width 20 nsec was irradiated to the amorphous silicon film 103 through the silicon oxide or silicon nitride film to improve the crystallinity of the silicon film 103. This step is shown in FIG. 1(A). Laser beam was applied at an energy density of from 200 to 400 mJ/cm$^2$, and preferably, at a density of from 250 to 300 mJ/cm$^2$. The crystallinity of the silicon film thus deposited was studied by Raman scattering spectroscopy to identify a relatively broad peak at about 515 cm$^{-1}$, i.e., a peak different from a peak assigned to single crystal silicon which should appear at 521 cm$^{-1}$. A further uniform crystal can be obtained by applying an auxiliary heat thereto by heating at 100 to 500° C. during the laser irradiation. The resulting crystal was then annealed in hydrogen at 350° C. for 2 hours.

Subsequently, the protective layer 104 was removed to expose the silicon layer 103, and the exposed surface was patterned into an island-like shape to establish an NTFT region 105 and a PTFT region 106. Furthermore, a film having obtained by sputtering in an oxygen atmosphere or by decomposing TEOS and depositing using plasma CVD process was further annealed at a temperature range of from 450 to 650° C. to form a gate oxide film 107. Sufficient care should be taken in treating a large area substrate by the latter process, i.e., the plasma CVD process, because strain and shrinkage may form on the substrate during the process depending on the heating temperature. If such a strain and shrinkage should generate on the substrate, difficulties should be found in the mask alignment process which is to be conducted in the later fabrication step. In the sputtering process, on the other hand, the substrate can be maintained at a temperature of 150° C. or lower. It is preferred, however, that an annealing is conducted at about 450° C. in hydrogen to reduce the dangling bonds and the like inside the film to thereby prevent the gate oxide film from being influenced by the fixed charges.

Figure 1B:
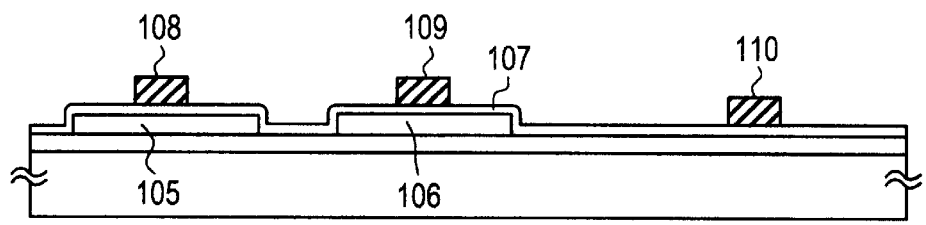

An aluminum film was further deposited thereafter to a thickness of from 200 nm to 5 μm by electron beam vapor deposition process, and was thereafter patterned to obtain gate contact 108 and 109 as illustrated in FIG. 1(B). A gate contact 110 of the TFT (reverse stagger type) of the active matrix circuit was formed simultaneously with the formation of the gate contact 108 and 109.

Figure 1C:
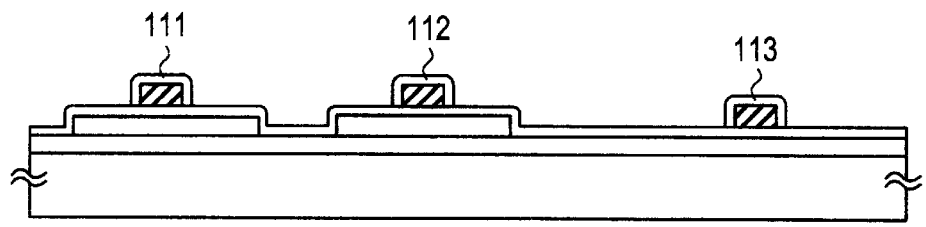

FIG. 1(C) illustrates the manner of forming anodic oxide layers 111 to 113 around the gate contacts. This process comprises applying current to the gate contact of the substrate being immersed into an electrolytic solution. In carrying out this step, preferably, the anodic oxide film on the TFT (the TFT on the left hand side of the figure) in the region of the peripheral circuit is provided as thin as possible to increase the mobility, while providing a thick anodic oxide film on the portion corresponding to the TFT (the reverse staggered TFT located on the right hand side of the figure) of the active matrix portion to thereby prevent gate leak. The anodic oxidation films in this example were formed at thicknesses in the range of from 200 to 250 nm.

Impurities were introduced into the island-shaped silicon film of each of the TFTs by ion doping process in a self-aligned manner using the gate contact portion (i.e., the gate contact and the surrounding anodic oxide film) as the mask. In carrying this process, phosphorus was implanted first over the entire surface using phosphine (PH$_3$) as the doping gas, and then boron was implanted using diborane (B$_2$H$_6$) as the doping gas while covering the island portion 105 alone with a photoresist, so that boron may be introduced only into the island portion 106. Phosphorus and boron in this step were introduced at a dose of from 2×10$^{15}$ to 8×10$^{15}$ cm$^{-2}$ and from 4×10$^{15}$ to 10×10$^{15}$ cm$^{-2}$, respectively, so that the dose of boron may be higher than that of phosphorus.

Figure 1D:
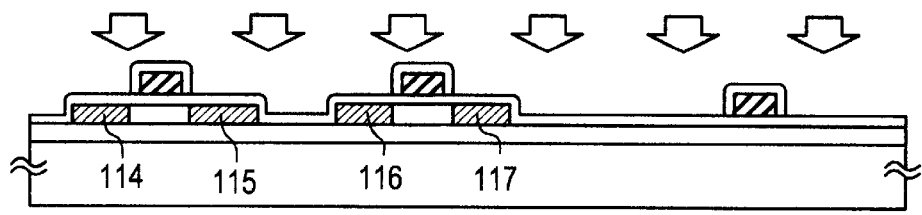
Figure 1E:
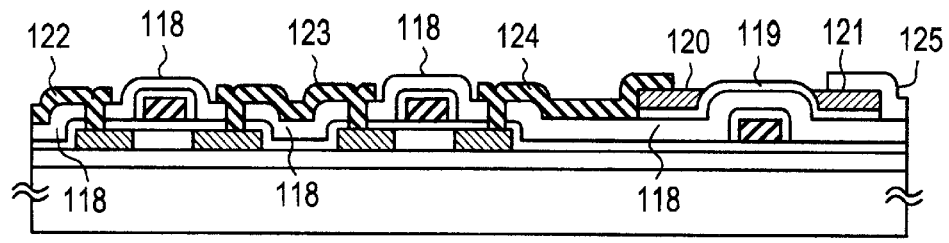

The resulting structure was then subjected to laser beam irradiation using a KrF excimer laser emitting a light at a wavelength of 248 nm and being operated at a pulse width of 20 nsec as shown in FIG. 1(D), so that the crystallinity of the portion may be recovered from the damage it had received by the introduction of impurities. The laser beam was applied at an energy density of from 200 to 400 mJ/cm$^2$, and preferably, from 250 to 300 mJ/cm$^2$. A further homogeneous crystal can be obtained by applying an auxiliary heat by heating in the temperature range of from 100 to 500° C.

Thus was obtained N-type regions 114 and 115, and P-type regions 116 and 117. The sheet resistivity of the regions was found to be in the range of from 200 to 800 Ω/sq.

Then, a 300 nm thick silicon oxide film was deposited over the entire surface by sputtering as an interlayer insulator 118. This silicon oxide film may be replaced by a silicon nitride film having deposited by plasma CVD. The film thus obtained functions as a mere interlayer insulator in a peripheral circuit, but care must be taken in its fabrication when it is brought into an active matrix portion, because then it functions as a gate insulator for TFTs.

An amorphous silicon layer 119 was then deposited on the gate contact 110 of the active matrix portion at a thickness of from 20 to 50 nm, and a microcrystalline silicon layer which serves as the source/drain of the a-Si TFT was deposited by plasma CVD at a thickness of from 50 to 100 nm. The resulting microcrystalline silicon film was patterned to obtain source/drain 120 and 121.

Contact holes were then perforated on the source/drain of the TFTs of the peripheral circuit portion to establish aluminum connection 122, 123, and 124. It can be seen in this case that an inverter circuit is formed by the NTFT and the PTFT in the left hand side. Furthermore, a pixel electrode 125 was formed with a light-transmitting electrically conductive material such as an ITO on the TFT in the active matrix portion. Finally, the resulting structure was annealed in hydrogen for 2 hours at 350° C. to reduce the dangling bonds in the silicon film to obtain a peripheral circuit being integrated monolithically with the active matrix circuit. In the present example, a reverse-staggered type TFT was used as the a-Si TFT of the active matrix to prevent incident light to enter the channel portion, because the electric conductivity of an a-Si easily changes upon irradiation of light. Needless to say, a planar TFT can be applied as well if an effective countermeasure would be taken to shield the TFT from the external light irradiation.

An illustrative example of the characteristics of a TFT assembled in a peripheral circuit having fabricated according to the present example is shown in FIG. 6. The TFT was obtained by irradiating KrF laser beam in vacuum to a 20 nm thick protective layer having formed on a LPCVD-deposited 50 nm thick silicon film to crystallize the silicon film. The KrF laser was operated at an energy density of 250 mJ/cm$^2$, and 10 shots was applied to the film. Then, after removing the protective layer, a 120 nm thick silicon oxide film was deposited thereon by sputtering to obtain a gate dielectric. After forming a gate contact, a 206 nm thick anodic oxide film was formed by anodic oxidation to use as a mask in the subsequent ion implantation. The ion implantation was conducted by bombarding the structure with phosphorus ions being accelerated at an energy of 65 keV and boron ions being accelerated at 80 keV to establish the impurity regions in a self-aligned manner, and activation was conducted thereafter by irradiating 10 shots of pulsed KrF laser beam at an energy density of 300 mJ/cm$^2$ in air.

Figure 6A:
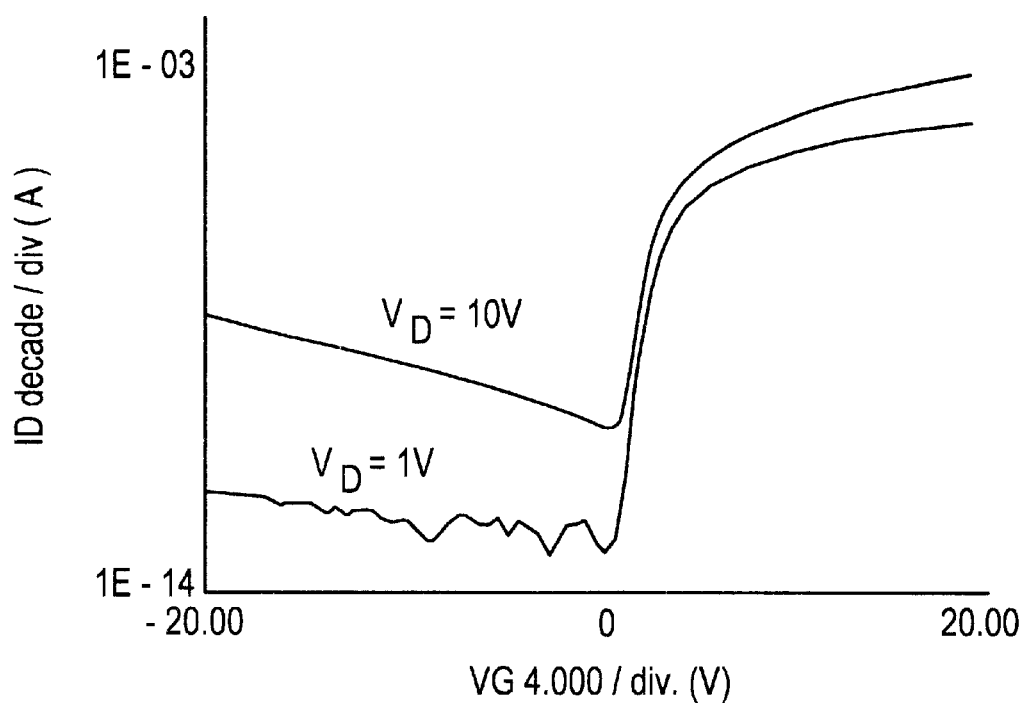
FIG. 6, (A) and (B), are graphs showing the characteristics of a TFT according to the invention.
Figure 6B:
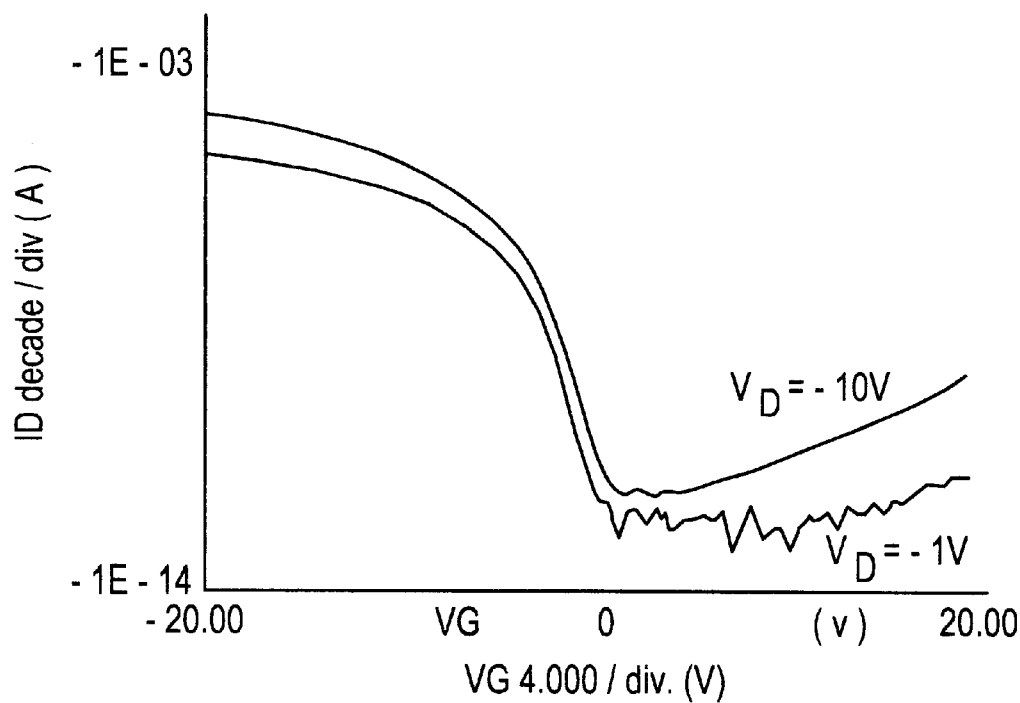

FIGS. 6(A) and 6(B) each show the characteristics of an NTFT and a PTFT, respectively. The channel of the TFT is 3.5 μm in length and 15 μm in width. The field mobility was found to reach 60 cm$^2$/Vs in NTFT and 30 cm$^2$/Vs in PTFT. Furthermore, an S value, which shows the steepness of the ON/OFF of a TFT, was obtained as 0.42 V/digit for an NTFT and 0.53 V/digit for a PTFT. The threshold voltage of the NTFT was found to be 3.9 V, and that of the PTFT was found to be −5.4 V. The ON/OFF ratio for a drain voltage of 1 V or −1 V was obtained as 8.7 digits for the NTFT and as 6.9 digits for the PTFT.

EXAMPLE 2

The present example provides an active matrix having formed on a soda-lime glass substrate. Because a soda-lime glass is rich in sodium, a silicon nitride coating 202 was deposited by plasma CVD at a thickness of from 5 to 50 nm, preferably, at a thickness of from 5 to 20 nm, over the entire surface of a soda-lime glass substrate 201 having a thickness of 1.1 mm and an area of 300× 400 mm. The silicon nitride coating above prevents sodium from diffusing into the TFT from the soda-glass substrate. This technology of providing a blocking layer on a substrate by coating the substrate with a silicon nitride or an aluminum oxide film is disclosed in Japanese Patent Application Nos. Hei-3-238710 and Hei-3-238714 filed by the present inventors. In addition, the coating 202 may otherwise be an aluminum nitride film.

Figure 2A:
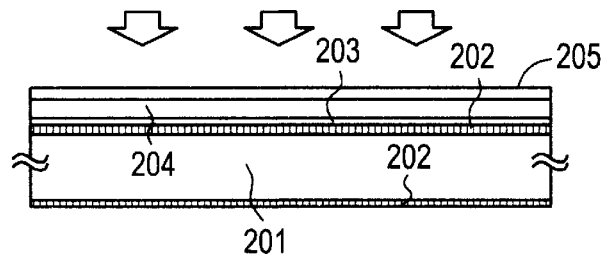
FIG. 2, (A)–(E), are cross-sectional views of another TFT, for illustrating steps successively performed to fabricate the TFT according to the invention.

Then, after forming a silicon oxide film as a base oxide film 203, a silicon film 204 was deposited by plasma CVD or LPCVD process at a thickness of from 30 to 150 nm, preferably from 30 to 50 nm, and a silicon oxide film was deposited thereon as a protective layer 205. The resulting structure was then subjected to the irradiation of a KrF excimer laser as shown in FIG. 2(A) to improve the crystallinity of the silicon film 204. Laser beam was applied at an energy density of from 150 to 200 mJ/cm$^2$, i.e., at a value slightly lower than that of the laser beam used in Example 1. Furthermore, only 10 shots were applied. Accordingly, the crystallinity of the silicon film thus deposited was found to be closer to an amorphous state than the one obtained in Example 1. In fact, the hole mobility of the silicon film in this case was found to yield, more specifically, a value in the range of from 3 to 10 cm$^2$/Vs, a value lower than that obtained in the silicon film of Example 1.

Figure 2B:
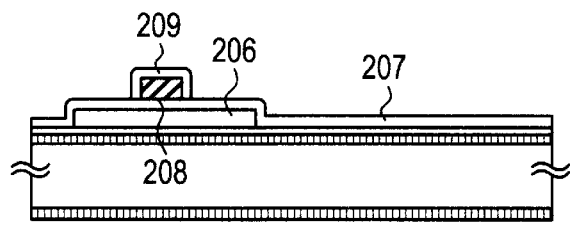

Subsequently, the protective layer was removed to expose the silicon layer, and the exposed surface was patterned into an island-like shaped region 206 to establish thereon a gate oxide film 207 at a thickness of from 50 to 300 nm, preferably, at a thickness of from 70 to 150 nm by sputtering. An aluminum film was deposited and patterned thereafter in the same manner as in Example 1 to obtain a gate contact 208, and the gate contact was surrounded with an anodic oxide 209. The resulting structure is shown in FIG. 2(B).

Figure 2C:
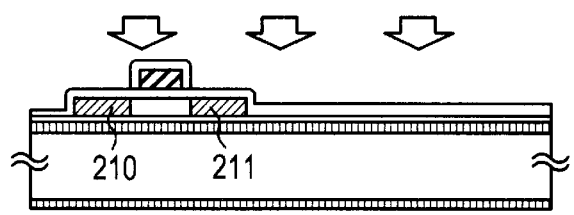
Figure 2D:
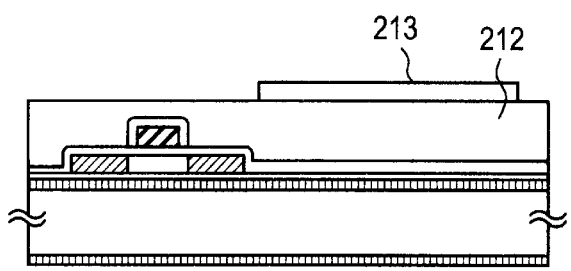

Boron was then introduced as a P-type impurity into the silicon layer in a self-aligned manner by ion doping, to thereby form source/drain 210 and 211 of the TFT. Subsequently, as illustrated in FIG. 2(C), the resulting structure was subjected to laser beam irradiation using a KrF excimer laser, so that the crystallinity of the portion may be recovered from the damage it had received by the introduction of impurities. The laser beam was applied at a rather high energy density of from 250 to 300 mJ/cm$^2$. Accordingly, a sheet resistivity in the range of from 400 to 800 Ω/sq., a value well comparable to the one obtained in Example 1 was obtained for the source/drain of the TFT.

Thus was obtained a TFT comprising an active layer having small field mobility, but best suited for use in an active matrix. More specifically, the TFT obtained in this example has a high ON resistance, however, the OFF resistance thereof is still sufficiently higher than the ON resistance. Accordingly, an additional capacitance which was conventionally necessary is no longer required. In particular, the source of a leak current in an N-channel MOS, i.e., the mobile ions such as sodium, casts no problem in a P-channel type device as referred in the present example.

The process according to the present example can be conducted at low temperatures with 350° C. being the maximum limit. The highest allowable temperature is attained at the fabrication of a silicon nitride film or a silicon oxide film. If the temperature were to be elevated as to exceed the maximum limit, the soda-lime glass would soften. In a process of such a low temperature, the defects in the gate oxide film sometimes causes problems. In the case of Example 1, the gate oxide film was annealed at a temperature lower than 450° C. because the substrate had a relatively high heat resistance to allow thermal annealing at such a high temperature. In the present Example using soda-lime glass substrate, however, such thermal annealing cannot be applied. Consequently, a large number of fixed charges, which are principally positive ones, would remain inside the gate oxide film. It follows that the resulting structure is not applicable to N-channel type MOS due to the excessively large leak current which generates by the presence of those fixed charges. In a P-channel type MOS, however, though the fixed charge certainly affects the threshold voltage, the leak current can be suppressed low so that the essential characteristic for an active matrix operation can be achieved. Furthermore, the source/drain were annealed with a high energy density laser beam to yield a low sheet resistance. This leads to the suppression of signal delay.

An interlayer insulator 212 was formed with polyimide thereafter. This step was followed by the formation of pixel electrode 213 using ITO. A contact hole was then established to form aluminum contacts 214 and 215 in the source/drain regions of the TFT. One 215 of the thus formed contacts was connected to the ITO. Finally, the hydrogenation of silicon was completed by annealing the resulting structure in hydrogen at 300° C. for 2 hours.

Four active matrices were formed on the resulting single substrate, and the entire structure was cut into four pieces to obtain four active matrix panels. The thus obtained active matrix has no peripheral circuit, and it can be driven only after connecting a driver IC thereto by a TAB process and the like. However, since a low cost soda-lime glass substrate is used in the place of an alkali-free glass substrate conventionally employed in an a-Si TFT AMLCD, the total cost is well comparable to those of the conventional panels. In particular, the panel according to the present Example was found best suited for large area fine displays. The active matrix thus obtained is shown schematically in FIG. 11. The active matrix 952 is connected to a peripheral circuit 951 comprising a driver TFT and a shift resister. A pixel 953 of the active matrix comprises a TFT 956, a liquid crystal layer 954, and an auxiliary capacitance 955.

An a-Si TFT, for instance, has a mobility in the range of about 0.5 to 1.0 cm$^2$/Vs, and was not applicable to large scale matrices which would exceed 1,000 lines. In contrast, the TFT according to the present example has a mobility as high as 3 to 10 times that of the conventional TFTs that it can be applied to such large scale matrices without any problem. Moreover, it would satisfactorily respond to analog-like gradation displays.

Furthermore, since the gate lines and the data lines are both made from aluminum, signal delay and attenuation can be considerably reduced even in a large display exceeding 20 inches in diagonal.

EXAMPLE 3

The present example provides a high contrast LCD taking advantage of both the diode characteristics and the memory function of a ferroelectric polymer, using a process having the fabrication cost being reduced by integrating the peripheral circuit monolithically on a single substrate. The LCDs having similar structures can be found disclosed in, for example, Japanese Patent Application No. Sho-61-1152.

This type of LCD allows a semi-static operation. Accordingly, a display of an extremely high contrast can be obtained despite a TN liquid crystal is operated in a direct multiplexing drive. Moreover, in contrast to MIM type non-linear elements, no problems are encountered in the fabrication process. The principle of its operation is illustrated in FIG. 4.

Figure 4A:
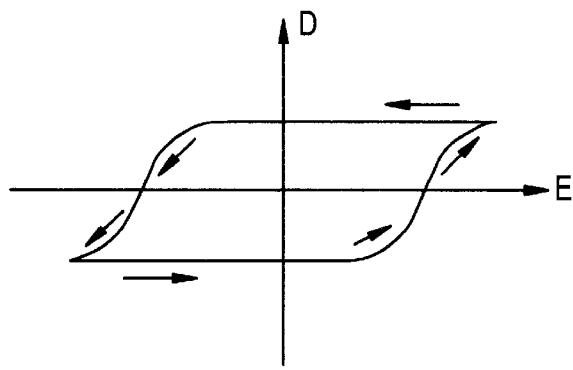
FIG. 4, (A)–(C), are diagrams illustrating the principle of operation of an LCD according to the invention.

In general, the E (electric field)—(electric flux density) characteristics of a ferroelectric exhibits a hysteresis curve as illustrated in FIG. 4(A). That is, the constant polarization which is formed in a ferroelectric material under a certain external electric field happens to be reversed upon application of an electric field exceeding a certain value. If an electric circuit is considered, this signifies charge transfer, and hence, current is generated therein. For instance, a serial connected circuit comprising a capacitor (FE) having incorporated a ferroelectric between the electrodes and a capacitor (LC, having a capacitance of C) having incorporated a material such as a liquid crystal between the electrodes may be considered. In practical use, a relatively high resistance R is generally parallel connected with a ferroelectric capacitor. Accordingly, a practical circuit results in a construction as illustrated in FIG. 4(C). It should be noted, however, that FE not only functions as a simple capacitor, but also as a non-linear resistor. The change of the current in the resulting circuit upon applying an alternating current to the circuit can be obtained as illustrated in FIG. 4(B), exhibiting non-linear characteristics to yield a hysteresis curve.

When a voltage of $-V_0$ or 0 is applied to one of the facing electrodes while applying a voltage of 0 or $+V_0$ to the other, the voltage of the cell results in one of $\pm 2V_0$, $\pm V_0$, and 0. If the voltage results in either $+2V_0$ or $-2V_0$, as illustrated in FIG. 4(B), the resistance of FE drops abruptly during its transition, and this signifies that a sufficient amount of charge is supplied to LC. If the voltage transition then occurs to yield any of the values $+V_0$, $-V_0$ and 0, the resistance of FE would not drop considerably this time. Consequently, the leak current from the parallel connected resistance R should be taken into consideration in this process. The discharge of the LC occurs by the leak current. It can be seen therefore that the stage in $\pm 2V_0$ corresponds to a selection stage, and that the other stages correspond to a non-selection stage.

Figure 4B:
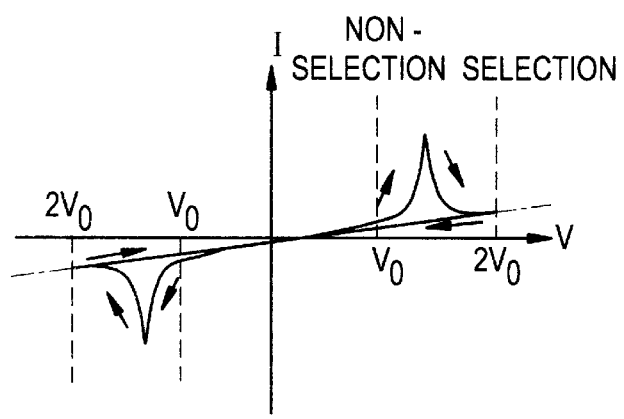
Figure 4C:
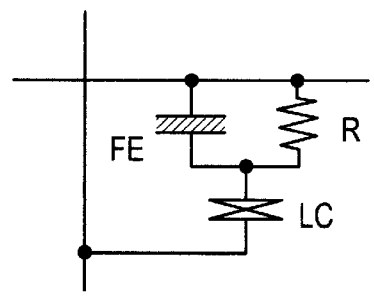

Referring to FIG. 4(B), the straight line passing through the origin and drawn with a dot-line curve represents the leak current due to R, and the relation between R and C is particularly important in using the device as an LCD. Though not discussed in detail here, only a low contrast would result if the time constant $\tau=RC$ should fall considerably shorter than the period of a frame because this signifies that the contribution of FE is very small. On the other hand, if $\tau$ should be exceedingly longer than the period of a frame, the result would be an annoying display full of after images. Accordingly, $\tau$ should be set as close as possible to the period of a frame.

Figure 5:
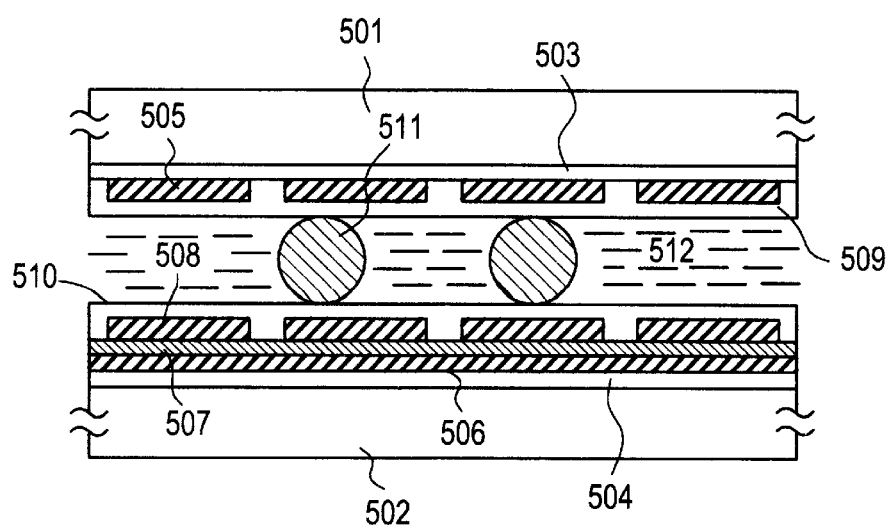
FIG. 5 is a cross-sectional view illustrating the cell structure of an LCD according to the invention.

A cell is schematically shown in FIG. 5. This cell is so constructed that a liquid crystal material 512 is sandwiched between two substrates 501 and 502, in the same way as an ordinary LCD. To make the thickness of the cell uniform, spacers 511 are interposed between the substrates. Usable liquid crystal materials include twisted-nematic liquid crystals, super twisted-nematic liquid crystals, untwisted nematic liquid crystals using birefringence, ferroelectric liquid crystals, and dispersion type liquid crystals (PDLCs) comprising a polymer in which a liquid crystal such as a nematic liquid crystal or cholesteric liquid crystal is dispersed.

In the same manner as generally adopted simple matrix liquid crystals, transparent stripe-shaped electrodes 505 and 506 made of ITO or another similar material are arranged so as to intersect each other at right angles. The difference with an ordinary simple matrix structure is that a transparent conductive coating of ITO or another similar material taking the form of islands is formed over one electrode 506 with a ferroelectric polymer 507 therebetween. Orientation films 509 and 510 are formed so as to cover these electrodes. This structure is described in detail in Japanese Patent Application No. 1152/1986.

The LCD constructed in this way is driven by a TAB connection of ICs in a conventional manner. This configuration has some limitations. First, in the LCD of this system, the voltage applied to the liquid crystal assumes value 1 or 0. This voltage is kept applied throughout substantially one whole frame to achieve high contrast, which is one feature of this system. Accordingly, when an image is displayed at various gray levels, it is difficult to accomplish an analog gray-scale display, which is usually done in TFT LCDs. Also, neither the pulse modulation method nor the frame modulation method, which are employed in STN LCDs, can be adopted. As a result, the LCD relies on a two-dimensional gray scale. This greatly increases the number of pixels.

The above itself is not an intrinsic difficulty with this LCD. That is to say that a large-capacity matrix can be rather easily attained due to the simple structure of this kind of LCD. In practice, however, where the density of connected terminals reaches 20 lines/mm, it is no longer possible to cope using the TAB system. Furthermore, it is difficult to fabricate the LCD by the COG (chip-on-glass) method. Therefore, it has been required that a peripheral driver circuit be formed monolithically on the same substrate.

For example, in order to achieve a two-dimensional gray scale with 64 gray levels, 6 subsidiary pixels are needed per pixel. Hence, the number of rows needed is two or three times as many as the number of rows in a normal matrix structure. If the present system is adopted in a high-definition screen in compliance with XGA standards, the number of rows reaches 1500 to 3000. Even in the case of a 15-inches. diagonal large-sized screen, a density of 10 to 15 lines/mm is needed. As the screen is narrowed, a higher-density packing is required. Especially, where a projection-type display is built using both the present system of LCD and a high-transmittance liquid crystal PDLC, the diagonal of the substrates is less than 5 inches.

At this time, high-speed IC operation is necessitated in addition to high-density packing. In this case, a circuit on an insulating substrate is less liable to loss than a circuit on a semiconductor substrate of a single crystal and can operate at a higher speed. However, if the field mobility is less than 10 $cm^2$/V.s as in Example 2, problems occur using that configuration. Therefore, it is required that the mobility be more than 30 $cm^2$/V.s, preferably more than 50 $cm^2$/V.s.

Figure 3A:
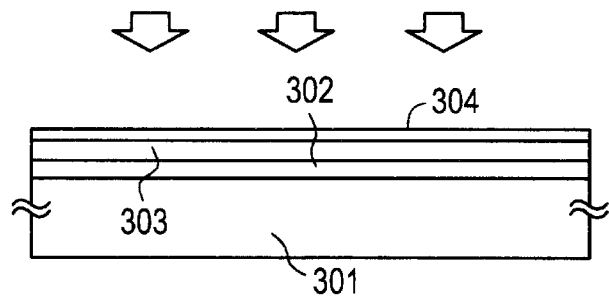
FIG. 3, (A)–(D), are cross-sectional views of a further TFT, for illustrating steps successively performed to fabricate the TFT according to the invention.

For this reason, a low-temperature process using laser annealing or intense light similar to laser is desired. A process for fabricating a peripheral circuit described in FIG. 3 is described below. Corning 7059 or other similar non-alkaline glass substrate is used as a substrate 301. This substrate measures 300 mm by 400 mm. An oxide film 302 made of silicon oxide is formed as a base layer on the substrate. In addition, a silicon layer 303 and a protective layer 304 are formed. As shown in FIG. 3(A), the laminate is irradiated with laser radiation under the same conditions as in Example 1.

Figure 3B:
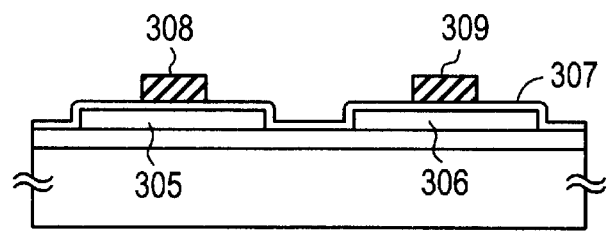

Subsequently, the silicon layer is photolithographically patterned into islands to form NTFT regions 305 and PTFT regions 306 and a gate oxide film 307 is fabricated from silicon oxide. As shown in FIG. 3(B), aluminum gate electrodes 308 and 309 are formed. Since the aluminum has to withstand later laser irradiation, the aluminum gate electrodes are formed by electron-beam vaporization so as to impart high reflectivity thereon. Aluminum grains formed by sputtering are as large as about 1 μm, and the surface of the aluminum coating is very rough. Therefore, when the aluminum coating is irradiated with laser radiation, the coating is damaged severely. The aluminum film formed by electron-beam evaporation has a surface which is so flat that the existence of grains cannot be confirmed by an optical microscope. Observation with an electron microscope reveals that the grain sizes are less than 200 nm. That is, the grain sizes must be smaller than the wavelength of the laser radiation used.

Figure 3C:
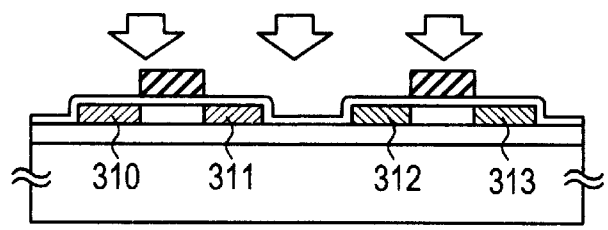

Thereafter, N-type dopant or phosphorus ions is/are implanted into regions 310 and 311. P-type dopant or boron ions is/are introduced into regions 312 and 313. As shown in FIG. 3(C), a laser annealing process is performed. Laser irradiation is carried out under the same conditions as in Examples 1 and 2. During this process, the aluminum gate electrodes are essentially undamaged.

Figure 3D:
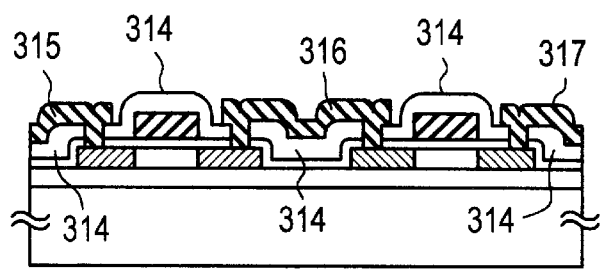

Finally, as shown in FIG. 3(D), an interlayer insulator 314 is fabricated from silicon oxide and contact holes are formed therein. Aluminum interconnectors 315–317 are formed to interconnect the TFTs. A peripheral circuit is thus completed. Then, a stripe-shaped ITO film (not shown), and pixel electrodes are formed. The substrate is divided into quarters, each measuring 150 mm by 200 mm. In this manner, four substrates are obtained. A ferroelectric polymer or the like is deposited on two of the substrates by the method described in the above-cited Japanese Patent Application No. 1152/1986, then two substrates are bonded together as shown in FIG. 5 to complete an LCD.

EXAMPLE 4

The present example is illustrated in FIG. 7, which lies in the use of novel laser-crystallized silicon TFTs (thin film transistor) in a peripheral circuit for a TFT liquid-crystal display. Unlike Example 1, TFTs (thin film transistor) in an active-matrix circuit region are made of top-gate amorphous silicon, i.e., the gates are located on the opposite side of the substrate. In this case, the active layers of both TFTs can be fabricated by the same manufacturing process but under somewhat stricter conditions, because better laser-crystallized characteristics and better amorphous silicon characteristics are required. The active-matrix circuit and the peripheral circuit are provided on an insulating substrate.

First, an oxide film 702 forming a base layer is deposited by sputtering on a substrate 701 of Corning 7059 up to a thickness of 20 to 200 nm. A substantially amorphous silicon film of monosilane or disilane is deposited on the oxide film 702 by plasma CVD to a thickness of 50 to 150 nm. At this time, the substantially amorphous silicon film is required to function directly as amorphous silicon TFTs and to withstand laser irradiation. We have discovered that if the substrate temperature is set to 300–400° C. during fabrication of a substantially amorphous silicon film, then the characteristics of this substantially amorphous silicon film are improved. A protective silicon oxide film 705 having a thickness of 10 to 50 nm was formed on this substantially amorphous silicon film again by sputtering. Subsequently, the active-matrix circuit region is coated with a photoresist 706, and only the peripheral circuit is irradiated with laser radiation to heighten a crystallinity of the substantially amorphous silicon film of the peripheral circuit.

Figure 7A:
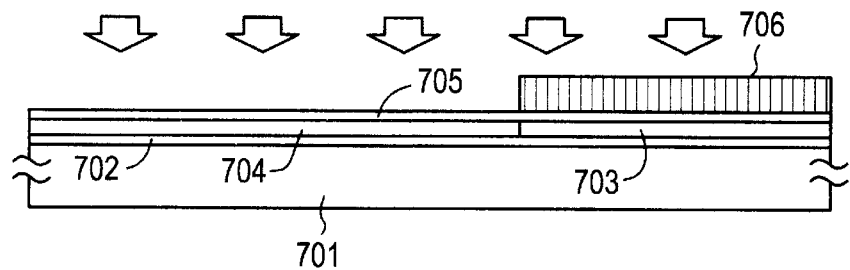
FIG. 7, (A)–(D), are cross-sectional views illustrating a method of fabricating a TFT according to the invention.

Under this condition, laser irradiation is performed as shown in FIG. 7(A). The kind of laser used and the conditions are the same as in Example 1. At this time, however, the energy density of the laser is preferably 200 to 250 mJ/cm$^2$ for the following reason. An excessive amount of hydrogen is contained in the amorphous silicon film formed by plasma CVD and if it is irradiated with intense laser radiation, the hydrogen changes into a gaseous state, expands, and destroys the film. The silicon film is crystallized as described above and a crystallized region 704 is formed. On the other hand, those portions which are coated with the photoresist are not illuminated by laser radiation and, therefore, are kept in an amorphous state.

Figure 7B:
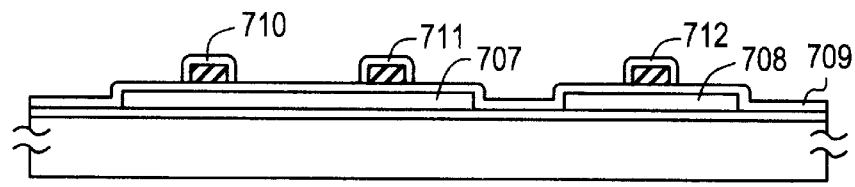

Subsequently, the silicon film is patterned into islands to form island region 707 for the peripheral circuit and island region 708 for the active-matrix region, as shown in FIG. 7(B). Silicon oxide is sputtered on these island regions to form a gate-insulating film 709. Metal gate electrodes 710, 711, and 712 coated with an anodic oxide films on surfaces thereof are formed in the same way as in Example 1.

Figure 7C:
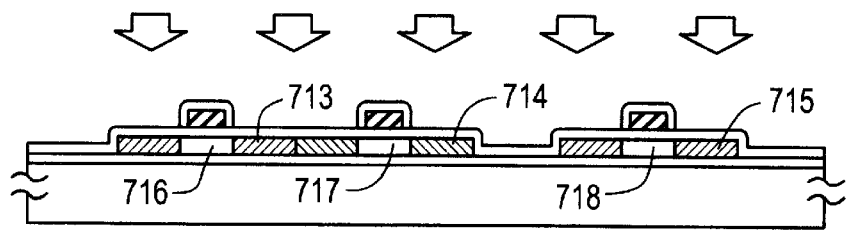
Figure 7D:
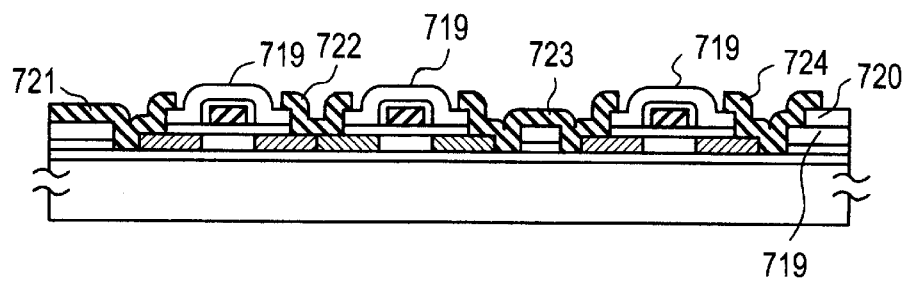

Then, as shown in FIG. 7(C), an N-type impurity is introduced into regions 713 and 715 with the gate electrodes 710 and 712 as masks. A P-type impurity is implanted into a region 714 with the gate electrode 711 as a mask. These regions are then irradiated with laser radiation with the gate electrodes as masks to crystallize the implanted regions under the same conditions as in Example 1. A high crystalline silicon is obtained therein. Regions 716 and 717 are already crystallized at the stage of FIG. 7(A), but a region 718 is not yet crystallized in this step. That is, in the TFT (the TFT in the active-matrix region) at the right side of FIG. 7, the source and drain crystallized but the active region is still a substantially amorphous silicon semiconductor. The active regions 716 and 717 of the thin film transistors in the peripheral circuit provided around the active matrix circuit comprise a crystalline semiconductor.

Finally, a silicon oxide film is deposited as an interlayer insulator 719 to a thickness of 400 to 1000 nm by TEOS plasma CVD. Then an ITO film 720 having a thickness of 100 to 300 nm is formed in the active-matrix region. This ITO film is patterned to form pixel electrodes. Contact holes are formed in the interlayer insulator. Metal wiring layers 721–724 are formed on the interlayer insulator. Thus, a TFT active-matrix liquid-crystal display is fabricated.

In this liquid-crystal display, the active regions of the thin-film transistors in the active-matrix circuit have lower crystallinity than the active regions of the thin-film transistors in the peripheral circuit. The active regions of the thin-film transistors in the active-matrix circuit are a substantially amorphous silicon film which exhibits a resistivity of $10^9$ Ω.cm or more in the dark.

In the present example, the TFTs forming the pixels are made of amorphous silicon TFTs which show a high resistivity in an OFF condition, in the same manner as in Example 1. However, the TFTs used in Example 1 are of the reverse-staggered type. In the present example, the TFTs are of the top-gate type. In Example 1, the step for fabricating TFTs of a peripheral circuit and the step for fabricating the TFTs of the active-matrix circuit are different except for the process for fabricating the gate electrodes. In consequence, the number of steps is increased. In the present example, the TFTs of the peripheral circuit and the TFTs of the active-matrix circuit are built at the same time. Hence, the number of manufacturing steps can be reduced.

A silicon film suitable as an amorphous silicon TFT is required to contain a large amount of hydrogen. However, the hydrogen content must be reduced as much as possible to crystallize the TFT by laser irradiation. Since these two requirements are in conflict with each other, a silicon film satisfying both conditions to a considerable extent must be formed. For example, where plasma CVD is used, if a silicon film is formed by the use of a high-energy plasma such as ECR plasma or microwave plasma, numerous crystallized clusters are contained in the film. This is ideal for the purpose of the present example. However, it presents the problem that resistivity in the OFF condition is somewhat low.

EXAMPLE 5

The present example is illustrated in FIG. 8. In Examples 1–4, the TFT regions are separated to electrically isolate them from each other. In the present example, a silicon film is formed over the whole surface and selectively crystallized. Also, a thick insulating film is employed to isolate the TFTs from each other.

Figure 8A:
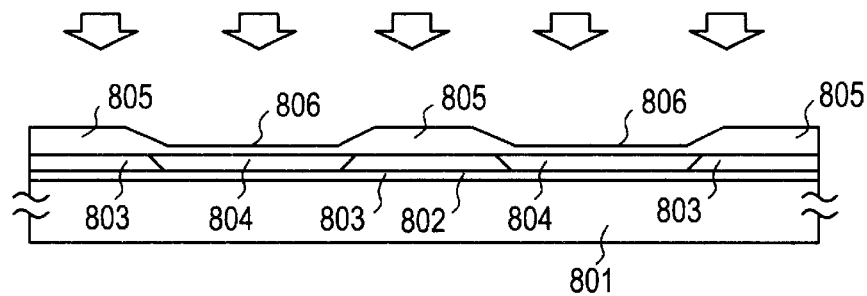
FIG. 8, (A)–(E), are cross-sectional views illustrating another method of fabricating a TFT according to the invention.

First, a silicon oxide film 802 forming a base layer is deposited on an insulating substrate 801. A substantially amorphous silicon film having a thickness of 50 to 150 nm or a silicon film having low crystallinity comparable to the crystallinity of the substantially amorphous silicon film is formed on the silicon oxide film 802. In the present example, it is necessary that the substantially amorphous silicon film sufficiently withstand laser irradiation and exhibit high resistivity. Therefore, the substantially amorphous silicon film is fabricated under the same conditions as in Example 4. Then, a silicon oxide film (an insulating film) having a thickness of 10 to 500 nm, preferably 10 to 50 nm, is formed over the entire surface of the substantially amorphous silicon film by plasma CVD. The silicon oxide film (insulating film) is selectively etched to obtain a region having removed therefrom the silicon oxide film (insulating film) or having thinned therein the silicon oxide film (insulating film). Thick silicon oxide film regions 805 and thin silicon oxide film regions 806 are then formed. At this time, if isotropic etching techniques are used, smoothly sloping steps are formed as shown in FIG. 8(A). Hence, breakage of the metal wiring layer which would otherwise be caused by steep steps can be prevented.

Under this condition, the laminate was lightly doped with boron ions and irradiated with laser light to crystallize the silicon film. As a result, as shown in FIG. 8(A), the substantially amorphous silicon layer was crystallized to heighten a crystallinity of portions 804 of the silicon film provided under said region having removed therefrom the silicon oxide film or having thinned therein the silicon oxide film. Other regions 803 were maintained in an amorphous state. The regions 804 take a substantially intrinsic or weak P-type because of the boron doping.

Figure 8B:
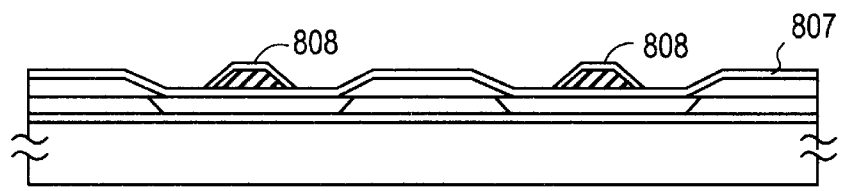
Figure 8C:
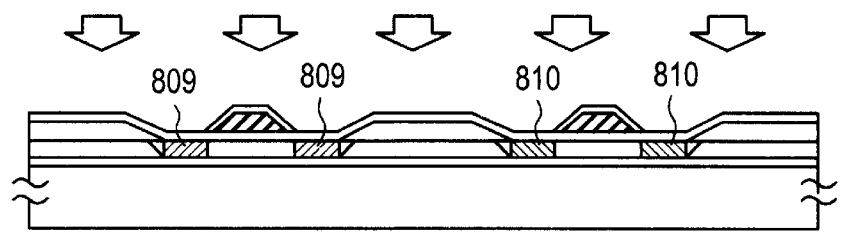
Figure 8D:
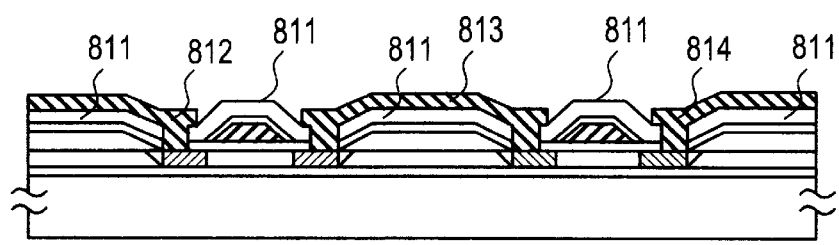
Figure 8E:
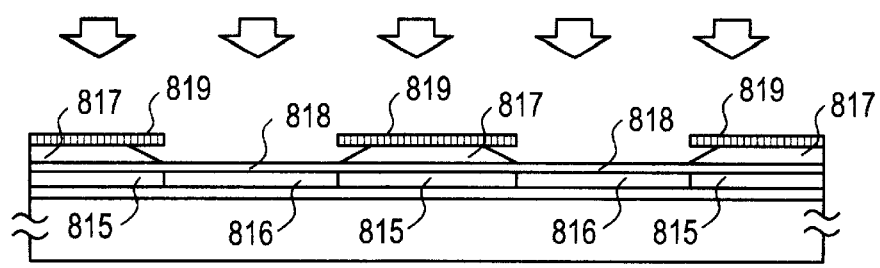

This step may be carried out by a method as illustrated in FIG. 8(E). In particular, after forming a silicon oxide film, a coating which has a thickness of 20 to 500 nm and is made of a material reflecting laser light such as aluminum, titanium, chromium, or the like or a material which does not transmit laser light is formed on the silicon oxide film. This coating is patterned photolithographically. Using this coating 819 as a mask, the silicon oxide film is isotropically etched. Thus, thick regions 817 and thin regions 818 are formed in the silicon oxide layer. The laminate is then irradiated with laser radiation while leaving the mask 819 behind, to selectively crystallize the amorphous silicon film. In this manner, crystallized regions 816 and amorphous silicon regions 815 are formed.

As shown in FIG. 8(B), a gate oxide film 807, or silicon oxide, is then formed to produce metal gate electrodes 808 provided with an anodic oxide. Since a wet etching method is used to etch the metal gates, the side surfaces of the gate electrodes taper. This shape is effective in preventing the conductive wiring layer from breaking at the intersections.

As shown in FIG. 8(C), N-type regions 809 and P-type regions 810 are then formed by selectively implanting at least one impurity into the silicon film with the gate electrode and the thick silicon oxide film regions 805 as masks by ion doping. These regions are irradiated with laser radiation to activate them. Thereafter, as shown in FIG. 8(D), an interlayer insulator 811 is deposited, and contact holes are formed therein. Metal wiring layers 812–814 are formed to complete the circuit. In the present example, a large amount of opaque amorphous silicon is left on the substrate and therefore this structure cannot be used as the active-matrix region of an LCD, for example. However, it can be used as a peripheral circuit region or as a driver circuit for an image sensor. In the present example, if a relatively thick (in excess of 100 nm) active layer is needed, steps for isolating elements are low. Accordingly, the possibility of breakage of the conductive wiring layers can be greatly reduced. This advantage is especially conspicuous in high-density integrated circuits.

EXAMPLE 6

The present example is illustrated in FIG. 9. Similarly to Example 5, a silicon layer is formed over the whole surface and selectively crystallized to isolate elements from each other. Breakage of wiring layers can be prevented more effectively because an uneven oxide film as used in Example 5 is not used.

Figure 9A:
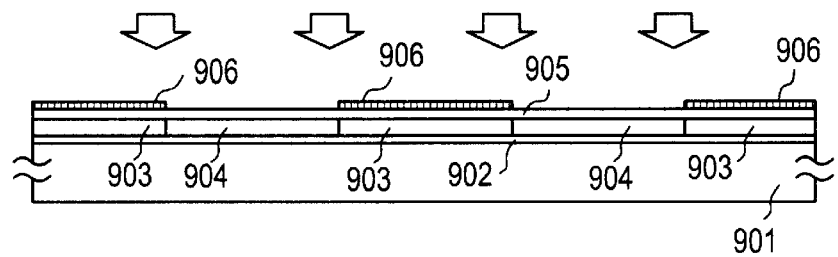
FIG. 9, (A)–(E), are cross-sectional views illustrating a further method of fabricating a TFT according to the invention.

First, a silicon oxide film 902 forming a base layer is deposited on an insulating substrate 901. A substantially amorphous silicon film having a thickness of 50 to 150 nm or a silicon film having low crystallinity comparable to that of the substantially amorphous silicon film is formed on the silicon oxide film 902. In the present example, it is also necessary that the substantially amorphous silicon film sufficiently withstand laser irradiation and exhibit a high resistivity. Therefore, the substantially amorphous silicon film is fabricated under the same conditions as in Example 4. Then, a protective film 905 of silicon oxide having a thickness of 20 to 100 nm is formed on the substantially amorphous silicon film. This silicon oxide film 905 can be left behind and subsequently form gate-insulating films for TFTs. As mentioned previously, it is to be noted that these TFTs have low mobility. Then, a coating having a thickness of 20 to 500 nm and made of a laser light-reflective material such as aluminum, titanium, chromium or the like, or a material which does not transmit laser light is formed on the silicon oxide film. This coating is photolithographically patterned. As shown in FIG. 9(A), using this coating 906 as a mask, a laser light is irradiated to the substantially amorphous silicon film to selectively crystallize the amorphous silicon layer. Thus, crystallized regions (crystalline semiconductor regions) 904 and substantially amorphous silicon semiconductor regions 903 are formed.

Figure 9B:
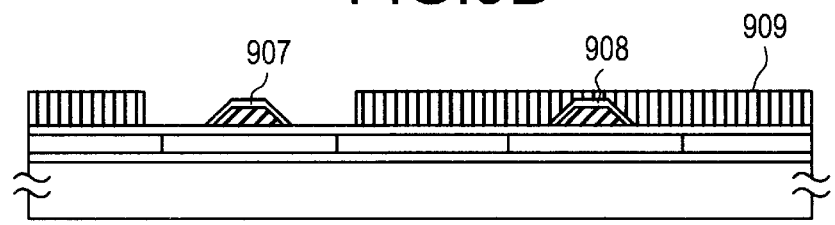

Then, as shown in FIG. 9(B), metal gate electrodes 907 and 908 having anodic oxide on surfaces of the gate electrodes are formed on the newly formed gate-insulating film over the crystalline semiconductor regions 904. Since a wet etching method is used to etch the metal gates, the side surfaces of the gate electrodes taper. This shape is effective in preventing the wiring layers from breaking at the intersections. Additionally, a photoresist 909 is applied and patterned to expose only N-channel TFTs.

Using the photoresist and the gate electrode as masks, an N-type impurity is implanted into the silicon film. In this condition, the laminate is irradiated with laser radiation to activate these implanted regions 912. At this time, the amorphous silicon would be crystallized unless the photoresist remains in regions other than the implanted regions. Where a relatively thick oxide film cannot be used to isolate elements as in the present example, leakage between the elements would undesirably result.

Figure 9C:
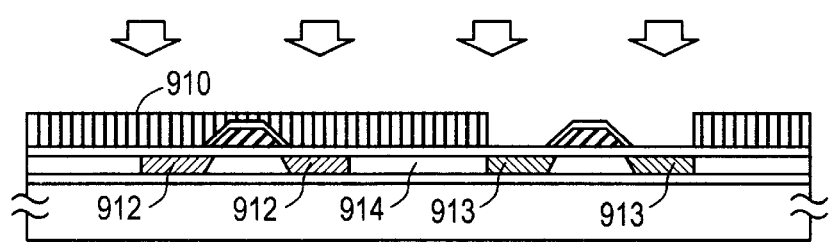

Similarly, with respect to P-channel TFTs, a photoresist 910 is applied. A P-type impurity is implanted while exposing only the P-channel TFTs, to form P-type doped regions 913. Then, as shown in FIG. 9(C), the laminate is irradiated with laser radiation while leaving the photoresist behind, to activate the already doped P-type regions 913. In the steps described thus far, the laser light does not impinge on regions 914 located between the N-type doped regions 912 and the P-type doped regions 912. Hence, the intervening regions 914 remained in a substantially amorphous silicon state. Accordingly, if wiring layers are formed on the overlying insulating coating 905 which is also a gate-insulating film, and if an inverted layer is formed by the wiring layers, the leakage current is infinitesimal, because the field mobility of the amorphous silicon is very small and the resistivity is very high. In practice, no problems occur.

Figure 9D:
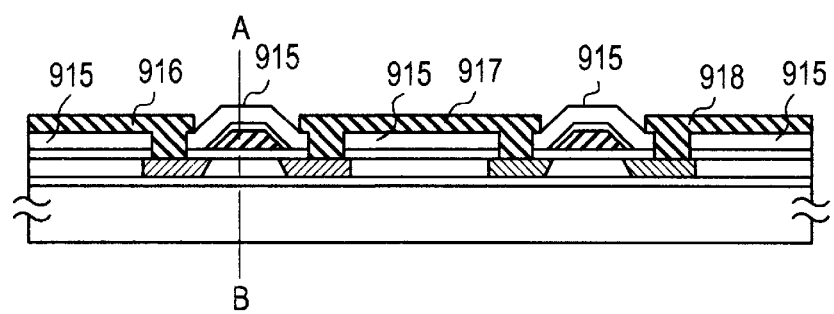

Then, as shown in FIG. 9(D), an interlayer insulator 915 is deposited, and contact holes formed in this insulator. Metal wiring layers 916–918 are formed, thus completing the circuit. In the present example, a large amount of opaque amorphous silicon is left on the substrate in the same way as in Example 5 and therefore this configuration cannot be used for the active-matrix region of an LCD, for example, but can be employed as a peripheral circuit region or as a circuit for driving an image sensor. In the present example, almost no steps exist between the gate electrodes, unlike Example 5. Consequently, the possibility of breakage of the wiring layers can be reduced dramatically. This advantage is especially conspicuous in high-density integrated circuits.

Figure 9E:
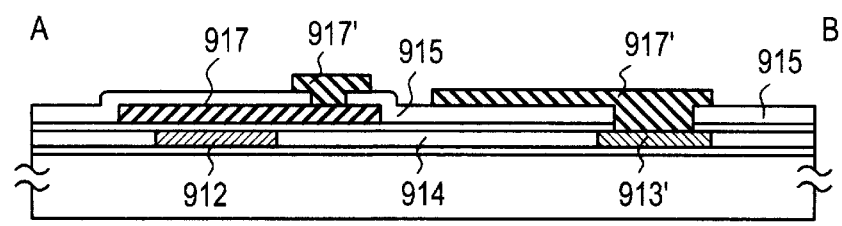

FIG. 9(E) shows another cross section of a TFT circuit fabricated in the present example. This is a cross section taken along the phantom line A–B of FIG. 9(D) through an N-channel TFT. As can be seen from this figure, crystallized doped regions 912, 913' and an intervening element-isolating region (a separation semiconductor) 914 are on the same plane and, therefore, the gate electrode 917 is flat. A wiring layer 917' which is in contact with the doped region 913' and with a gate electrode 907 has steps only in the locations of the contact holes and in the location of the interlayer insulator. Neither steps of island semiconductor regions as in Example 1 nor steps of thick insulating film for isolation of elements as in Example 5 exist. This is advantageous for manufacturing integrated circuits at a higher density with a high production yield. In the device shown in FIG. 9(D), the transistors are separated from each other by the separation semiconductor 914 provided between the crystalline semiconductor regions 904.

EXAMPLE 7

Figure 10A:
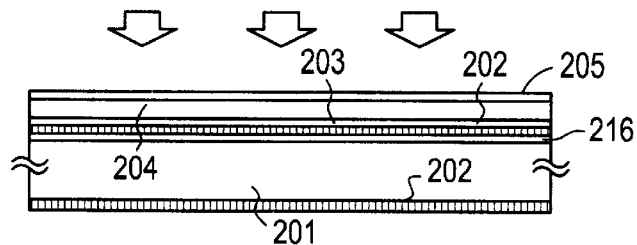
FIG. 10, (A)–(E), are cross-sectional views illustrating a still other method of fabricating a TFT according to the invention.

An example in which an active-matrix circuit is formed on a soda-lime glass substrate is given below. A soda-lime glass substrate having a thickness of 1.1 mm and measuring 300 mm by 400 mm is used as a substrate 201. A $SiO_2$ film 216 is formed on the substrate 201, as shown in FIG. 10(A). Then, a film 202 of AlN, SiN, or $Al_2O_3$ is formed over the whole surface of the substrate as shown in FIG. 10(A). Thereafter, steps are effected in the same way as in Example 2 to complete an active-matrix circuit. That is, after forming an oxide film 203, or silicon oxide, forming a base layer, a silicon film 204 having a thickness of 30 to 150 nm, preferably 30 to 50 nm, is formed by LPCVD or plasma CVD. Then, a protective layer 205 of silicon oxide is formed.

As shown in FIG. 10(A), the laminate is irradiated with KrF laser radiation to improve the crystallinity of the silicon film 204. At this time, the energy density of the laser radiation is set to 150 to 200 $mJ/cm^2$, which is slightly lower than the energy density used in Example 1. The number of shots of laser radiation is 10. The crystallinity of the resulting silicon film is closer to an amorphous state than in Example 1. In practice, the field mobility of positive holes in the silicon film obtained under this condition is 3 to 10 $cm^2/V.s$, which is lower than the field mobility obtained in Example 1.

Figure 10B:
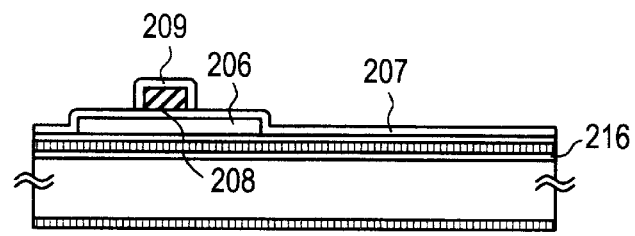

Then, the protective film is removed, and the silicon film is patterned into island regions 206. A gate oxide film 207 having a thickness of 50 to 300 nm, preferably 70 to 150 nm, is formed by sputtering. In the same way as in Example 1, aluminum gate electrodes 208 are formed. These gate electrodes 208 are coated with an anodic oxide 209, as shown in FIG. 10(B).

Figure 10C:
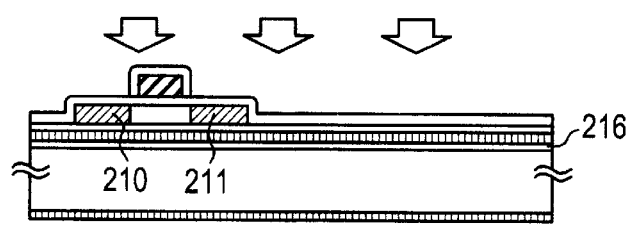
Figure 10D:
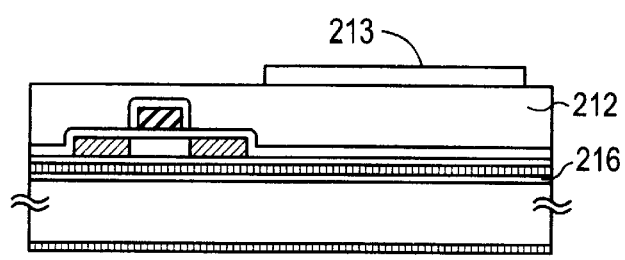
Figure 10E:
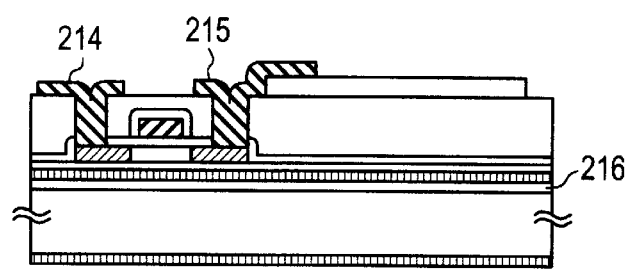

Boron ions are then implanted as P-type dopant ions into the silicon layer by self-alignment techniques to form the source/drain 210 and 211 of each TFT. As shown in FIG. 10(C), the laminate is irradiated with KrF laser radiation to improve the crystallinity of the silicon film, which deteriorates due to ion doping. At this time, the energy density of the laser radiation is set to a comparatively high value of 250 to 300 $mJ/cm^2$. Therefore, the sheet resistance of the sources/drains of these TFTs is 400 to 800 $\Omega/cm^2$, which is similar to the sheet resistance obtained in Example 1.

Although the field mobility of the active layer is small, this small mobility is advantageous when it is used as an active-matrix TFT. In particular, the ON resistivity is high but the OFF resistivity is higher still. This makes it unnecessary to provide an auxiliary capacitance as in the prior art techniques. Especially, moving ions such as sodium ions causes a leakage current from an N-channel MOS. In the present example, problems do not occur because it is of the P-channel type.

In the present example, the highest process temperature available is 350° C. during fabrication of the silicon nitride film or silicon oxide film. The soda-lime glass softens at higher temperatures. Where such a low-temperature process is needed, defects in the gate oxide film pose problems. In Example 1, the heatproofness of the substrate is relatively good and so the gate oxide film can be annealed up to a temperature of 450° C. This is impossible to achieve in the case of soda-lime glass substrates. The result is that numerous fixed charges are left in the gate oxide film. In this case, the fixed charges are primarily positive charges. Therefore, an N-channel MOS produces a large amount of leakage between the source and drain under the influence of the fixed charges and so the N-channel MOS cannot be employed in practice. However, in a P-channel MOS, fixed charges affect the threshold voltage but the low-leakage property essential for the operation of an active-matrix circuit is maintained. Since the sources/drains are annealed by a high-energy laser beam, sheet resistance is low, and the delay of signals is suppressed.

Thereafter, an interlayer insulator 212 is fabricated from polyimide. Pixel electrodes 213 are formed from ITO, and contact holes are formed. Electrodes 214 and 215 of aluminum are formed on the source/drain regions of TFTs. One electrode 215 is also connected with the ITO electrodes. Finally, the laminate is annealed within a hydrogen atmosphere at 300° C. for 2 hours, thus completing hydrogenation of the silicon.

Figure 11:
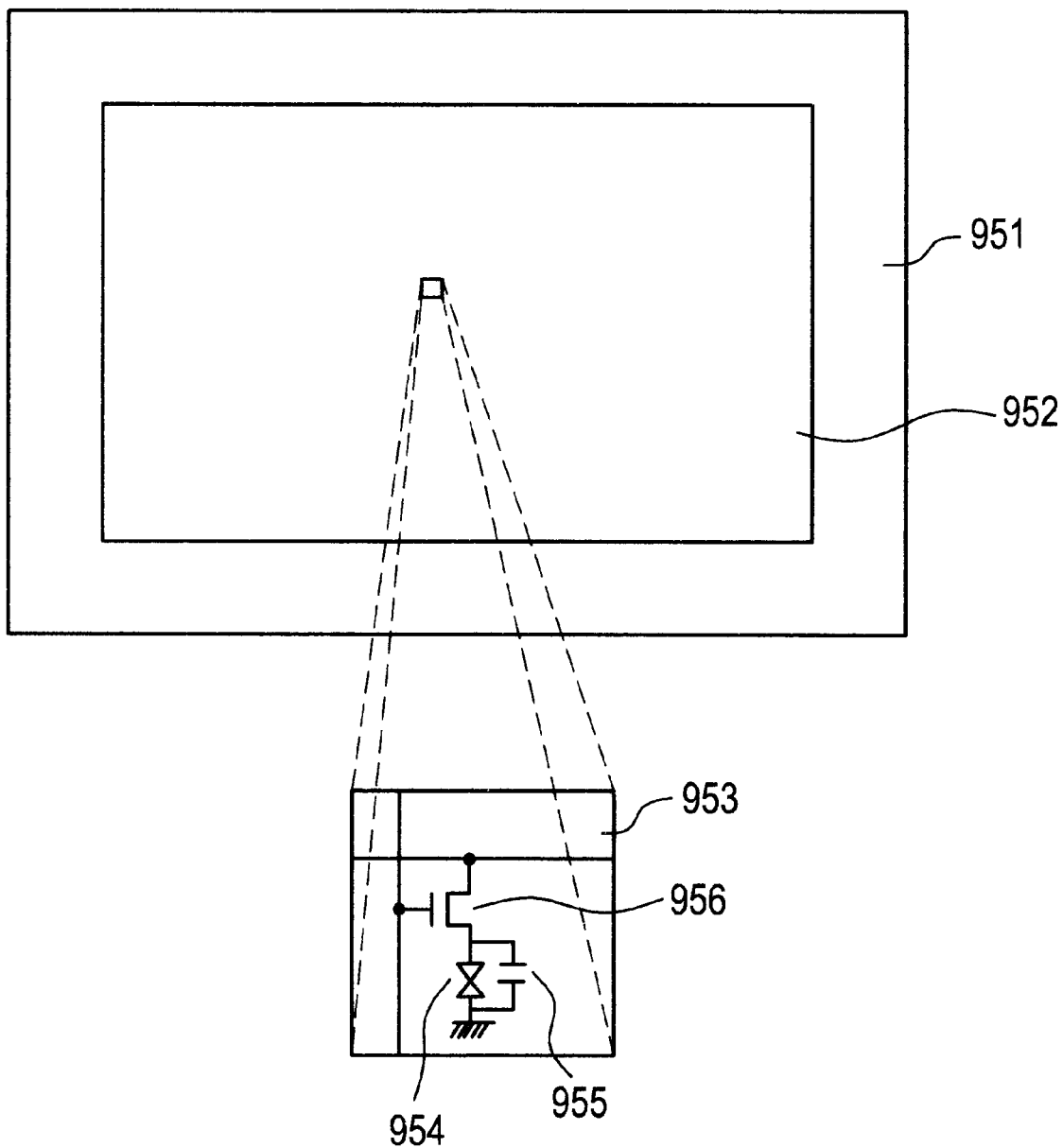
FIG. 11 is a front elevation partially in circuit diagram of an active-matrix circuit and a peripheral circuit according to the invention.

Four active-matrix circuits are formed on one substrate fabricated in this way. The substrate is divided into four active-matrix panels. In the present example, the active-matrix circuits have no peripheral circuits. Therefore, driving ICs must be connected with peripheral circuits by TAB or the like. Since the substrate is made of soda-lime glass which is cheaper than the non-alkaline glass substrate used in the prior art amorphous silicon TFT-AMLCD, the substrate in the present example is sufficiently profitable. Especially, the panel fabricated in the present example is suited for a large-sized, high-definition panel. The obtained active matrix is schematically shown in FIG. 11, where the active matrix is indicated by 952. A peripheral circuit 951 has a driver TFT and a shift register. One pixel of the active matrix is indicated by reference numeral 953. Also shown are a TFT 956 of the active matrix, a liquid crystal layer 954, and an auxiliary capacitance 955.

In the prior art amorphous silicon TFT, the mobility is on the order of 0.5 to 1.0 cm$^2$/V.s. Hence, it has been impossible to apply this TFT to a large-sized matrix having more than 1000 rows. In the present example, the mobility is 3 to 10 times the mobility of the amorphous silicon and therefore problems do not occur. In addition, TFTs in the present example can sufficiently respond to analog gray-scale representation. Further, the gate lines and data lines are made of aluminum. In a large-sized screen having a diagonal exceeding 20 inches, delay and attenuation of signals can be greatly reduced.

EXAMPLE 8

An example of the fabrication of a TFT according to the present invention is illustrated in FIG. 12. First, a substrate 1101 of Corning 7059 measuring 300 mm by 300 mm or 100 mm by 100 mm is prepared. An aluminum nitride film 1102 having a thickness of 1000 to 2000 Å is deposited by reactive sputtering techniques. Using the aluminum as a target, a sputtering process is performed in an atmosphere of nitrogen and argon. Where the ratio of the nitrogen is 20% or more, a coating having good thermal conductivity is derived. Where the pressure at the time of sputtering is $1\times10^{-4}$ to $1\times10^{-2}$ torr, favorable results can be obtained. The deposition rate is 20 to 200 Å/min. During deposition, the substrate temperature can be increased to 100–500° C.

The aluminum nitride film 1102 is formed on both faces of the substrate to confine foreign elements such as sodium, either contained in the substrate or adhered to the surface after shipment, for preventing deterioration in the characteristics of the TFTs. The aluminum nitride film 1102 also serves to reinforce the surface of the substrate, for preventing the surface from being scratched. Especially, where TFTs are used in an active-matrix liquid-crystal display, the surface having no TFTs is exposed to the external environment and easily scratched. If scratches are formed, they reflect light irregularly, thereby darkening the screen. After the formation of the aluminum nitride film, an oxide film 1103 acting as a base layer and having a thickness of 1000 to 3000 Å is formed on the surfaces on which TFTs are to be formed. To form this oxide film, sputtering may be performed in an oxygen atmosphere. Alternatively, TEOS may be decomposed and deposited by plasma CVD in an ambient of oxygen, and the resulting film may be annealed at 450 to 650° C.

Then, an amorphous silicon film is deposited to a thickness of 300 to 1500 Å, preferably 500 to 1000 Å, by plasma CVD or LPCVD. This film is photolithographically patterned into island silicon regions 1104. A silicon oxide film having a thickness of 200 to 1500 Å, preferably 500 to 1000 Å, is then formed. This silicon oxide film serves also as a gate-insulating film. Therefore, sufficient care must be paid in fabricating this film. In the present example, the film is fabricated from TEOS. TEOS is decomposed and deposited together with oxygen at a substrate temperature of 150 to 400° C., preferably 200 to 250° C., by RF plasma CVD. The ratio of the pressures of TEOS and oxygen is 1:1 to 1:3. The pressure is 0.05 to 0.5 torr. The RF power is 100 to 250 W. Alternatively, the film can be fabricated from TEOS together with ozone gas by low-pressure CVD or atmospheric pressure CVD at a substrate temperature of 150 to 400° C., preferably 200 to 250° C. After the formation of the film, the laminate is annealed at 300–500° C. for 30 to 60 minutes in an atmosphere of oxygen or ozone.

Figure 12A:
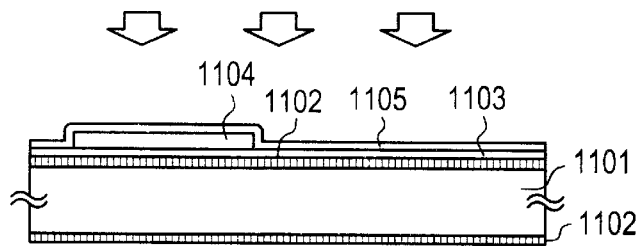
FIG. 12, (A)–(E), are cross-sectional views illustrating yet another method of fabricating a TFT according to the invention.
Figure 12B:
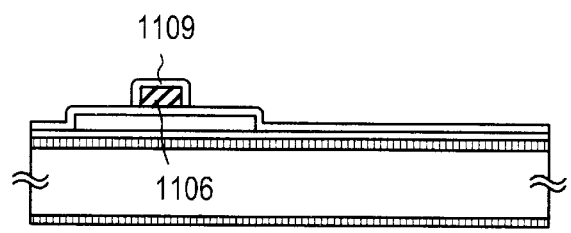

Then, as shown in FIG. 12(A), the laminate is irradiated with KrF excimer laser radiation having a wavelength of 248 nm and a pulse width of 20 nsec to crystallize the silicon region 1104. The energy density of the laser radiation is 200 to 400 mJ/cm$^2$, preferably 250 to 300 mJ/cm$^2$. During laser irradiation, the substrate is heated to 300 to 500° C. The crystallinity of the silicon film 1104 formed in this way has been examined by Raman spectroscopy, and a relatively broad peak was observed in the vicinity of a 515 cm$^{-1}$ different from the peak (521 cm$^{-1}$) of the single crystal of silicon. Then, the laminate is annealed at 350° C. for 2 hours in an atmosphere of hydrogen.

Subsequently, an aluminum film having a thickness of 2000 Å to 5 μm is formed by electron-beam evaporation and patterned photolithographically to form gate electrodes 1106. The aluminum can be doped with 0.5 to 2% silicon. The substrate is immersed in an ethylene glycol solution of 1–3% tartaric acid having a pH of about 7. The substrate is anodized while using a platinum plate as a cathode and this gate electrode of aluminum as an anode. At the beginning of anodization, the applied voltage is increased up to 220 V with a constant current. This condition is maintained for 1 hour and then the process is ended. In the present example, the appropriate rate at which the voltage is increased is 2 to 5 V/min. under the constant-current state. In this way, an anodic oxide 1107 having a thickness of 2000 Å is formed (FIG. 12(B)).

Subsequently, impurity ions, or phosphorus ions, are implanted into the island silicon regions of TFTs by a self-aligning ion doping process (also known as a plasma doping process) while using the gate electrodes as a mask. Phosphine (PH$_3$) is used as the doping gas. The dose is 2 to $8\times10^{15}$ ions/cm$^2$.

Figure 12C:
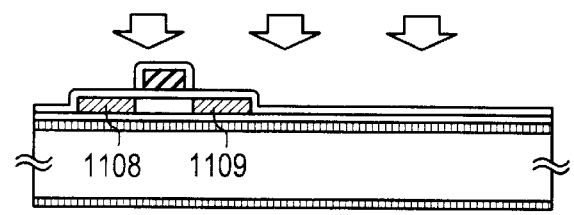
Figure 12D:
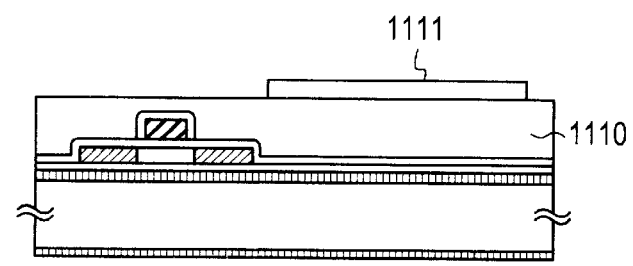

Then, as shown in FIG. 12(C), the laminate is irradiated with KrF excimer laser radiation having a wavelength of 248 nm and a pulse width of 20 nsec to improve the crystallinity of the silicon film, which deteriorates due to the ion doping. At this time, the energy density of the laser radiation is 150 to 400 mJ/cm$^2$, preferably 200 to 250 mJ/cm$^2$. In this way, N-type phosphorus-doped regions 1108 and 1109 are formed. The sheet resistance of these regions is 200 to 800 $\Omega$/cm$^2$.

Then, a silicon oxide film is deposited as an interlayer insulator 1110 having a thickness of 3000 Å over the whole surface by plasma CVD using both TEOS and oxygen or by low-pressure or atmospheric-pressure CVD using TEOS and ozone. The substrate temperature is 150 to 400° C., preferably 200 to 300° C. After the formation of the film, this silicon oxide film is mechanically polished to flatten the surface. Furthermore, ITO is deposited by sputtering and patterned photolithographically to form pixel electrodes 1111 (FIG. 12(D)).

Figure 12E:
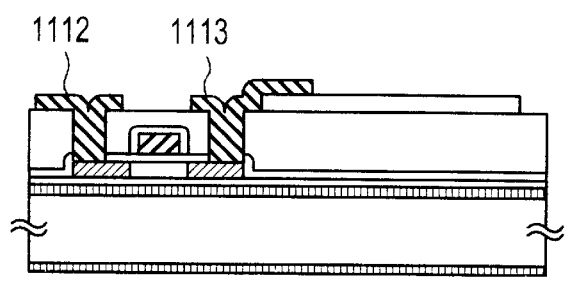

As shown in FIG. 12(E), contact holes are formed in the source/drain region of each TFT. Wiring layers 1112 and 1113 of chromium or titanium nitride are formed, the wiring layer 1113 being connected with the pixel electrodes 1111. Finally, the laminate is annealed at 200 to 300° C. for 0.1 to 2 hours in an ambient of hydrogen, thus completing hydrogenation of the silicon. In this manner, TFTs are completed. Numerous TFTs manufactured at the same time are arranged in rows and columns to build an active-matrix liquid-crystal display.

EXAMPLE 9

An example of fabrication of an TFT according to the invention is illustrated in FIG. 13. First, an aluminum nitride film 402 having a thickness of 1000 to 2000 Å is deposited on a substrate 401 of Corning 7059 by a reactive sputtering method. Using the aluminum as a target, sputtering is effected in an atmosphere of nitrogen and argon. Where the nitrogen accounts for more than 20%, a coating having good thermal conductivity is derived. During sputtering, a pressure of $1\times10^{-4}$ to $1\times10^{-2}$ torr produces favorable results. The deposition rate is 20 to 200 Å/min. During deposition, the substrate temperature can be increased to 100 to 500° C.

Then, a silicon oxide film having a thickness of 1000 to 3000 Å is formed as an oxide film 403 forming a base layer. To form this oxide film, sputtering may be carried out in an oxygen atmosphere. Alternatively, TEOS may be decomposed and deposited by plasma CVD in an ambient of oxygen, and the resulting film may be annealed at 450 to 650° C.

Thereafter, an amorphous silicon film having a thickness of 1000 to 3000 Å, preferably 1000 to 1500 Å, is deposited by plasma CVD or LPCVD. The laminate is annealed at 600° C. for 48 hours in a nitrogen atmosphere. The obtained crystalline silicon film is patterned photolithographically into island silicon regions 404. Silicon oxide is deposited as a gate-insulating film 407 having a thickness of 200 to 1500 Å, preferably 500 to 1000 Å.

An aluminum film having a thickness of 2000 Å to 5 μm is formed by electron-beam evaporation and photolithographically patterned. The laminate is anodized under the same conditions as in Example 8 to form gate electrodes 409 and wiring layers 408. Then, dopant ions, or phosphorus ions, are implanted into the island silicon regions of TFTs by a self-aligning ion doping process (also known as a plasma doping process) while using the gate electrodes as a mask. Phosphine (PH$_3$) is used as doping gas. The dose is 2 to $8\times10^{15}$ ions/cm$^2$.

The laminate is irradiated with KrF excimer laser radiation having a wavelength of 248 nm and a pulse width of 20 nsec to improve the crystallinity of the silicon film, which deteriorates due to ion doping. The energy density of the laser radiation is 150 to 400 mJ/cm$^2$, preferably 200 to 250 mJ/cm$^2$. In this way, N-type doped regions 405 and 406 are formed. The sheet resistance of these regions is 200 to 800 $\Omega$/cm$^2$ (FIG. 13(A)).

Then, silicon oxide is deposited as an interlayer insulator 410 having a thickness of 3000 Å over the entire surface by plasma CVD, LPCVD, or atmospheric pressure CVD. A photoresist 411 is selectively applied. It is better to apply this photoresist at the intersections of wiring layers or at locations where contacts are attached to the wiring layers (FIG. 13(B)).

Figure 13A:
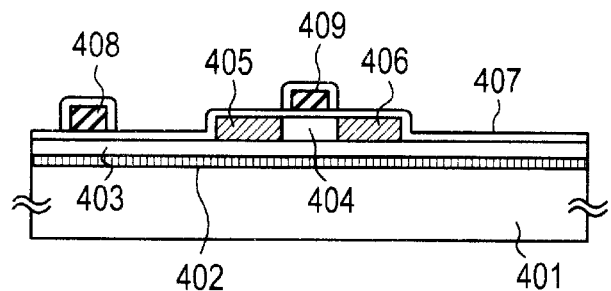
FIG. 13, (A)–(D), are cross-sectional views illustrating yet a further method of fabricating a TFT according to the invention.
Figure 13B:
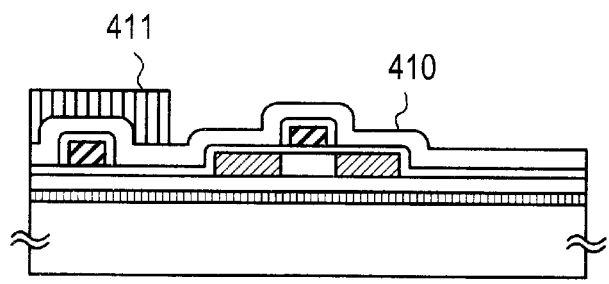
Figure 13C:
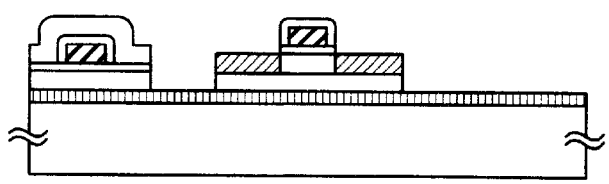
Figure 13D:
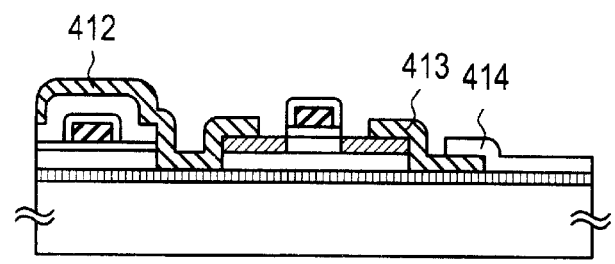
Figure 14A:
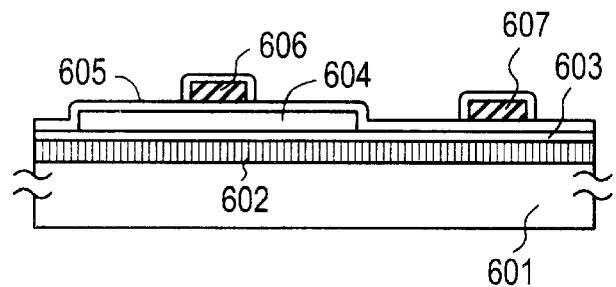
FIG. 14, (A)–(D), are cross-sectional views illustrating an additional method of fabricating a TFT according to the invention.
Figure 14B:
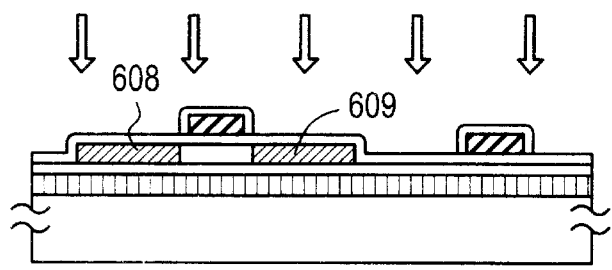
Figure 14C:
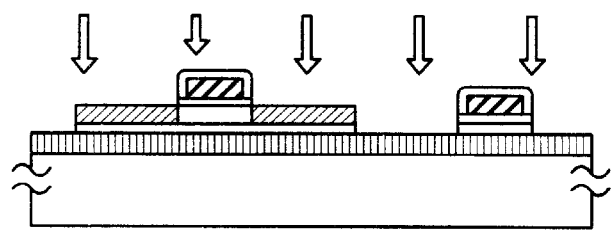
Figure 14D:
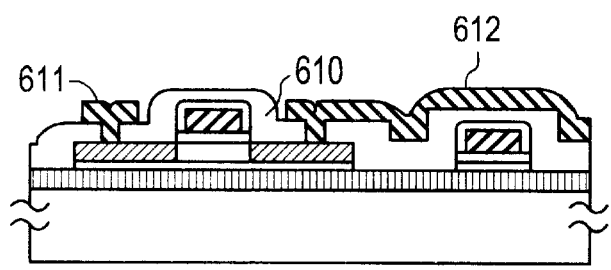

As shown in FIG. 13(C), using the photoresist 411 as a mask, the interlayer insulator 410, the gate insulator 407, and the base film 403 of silicon oxide are etched. Although the base film is etched away, the substrate is not etched away because the aluminum nitride film acts as a stopper. In this manner, a flat surface is obtained (FIG. 13(C)).

A titanium film having a thickness of 2000 Å to 5 μm is formed as a conductive interconnect material. This titanium film is patterned photolithographically to form wiring layers 412 and 413 connected with the source and drain of a TFT. ITO is selectively formed to produce pixel electrodes 414. Finally, the laminate processed in this way is annealed in a hydrogen at 350° C. for 30 minutes at 1 atm., thus completing hydrogenation of the laminate. In this way, one TFT is completed. Numerous TFTs manufactured at the same time were arranged in rows and columns to build an active-matrix liquid-crystal display.

EXAMPLE 10

An example of fabrication of a TFT according to the invention is illustrated in FIG. 14. First, an aluminum nitride film 602 having a thickness of 2000 to 4000 Å is deposited on a substrate 601 of Corning 7059 by a reactive sputtering method. Using the aluminum as a target, sputtering is effected in an atmosphere of nitrogen and argon. Where the nitrogen accounts for more than 20%, a coating having good thermal conductivity is derived. During sputtering, a pressure of $1\times10^{-4}$ to $1\times10^{-2}$ torr produces favorable results. The deposition rate is 20 to 200 Å/min. During deposition, the substrate temperature can be raised to 100 to 500° C.

Then, a silicon oxide film is deposited as an oxide film 603 having a thickness of 1000 to 2000 Å and forming a base layer. To form this oxide film, sputtering may be carried out in an ambient of oxygen. Alternatively, TEOS may be decomposed and deposited by plasma CVD in an ambient of oxygen, and the resulting film may be annealed at 450 to 650° C.

Subsequently, an amorphous silicon film having a thickness of 1000 to 3000 Å, preferably 1000 to 1500 Å, is deposited by plasma CVD or LPCVD. The laminate is annealed at 600° C. for 48 hours in a nitrogen atmosphere. The obtained crystalline silicon film is patterned photolithographically into island silicon regions 604. Silicon oxide is deposited as a gate-insulating film 605 having a thickness of 200 to 1500 Å, preferably 500 to 1000 Å.

An aluminum film having a thickness of 2000 Å to 5 μm is formed by electron-beam evaporation and photolithographically patterned. The laminate is anodized under the same conditions as in Example 8 to form gate electrodes 606 and a wiring layer 607 (FIG. 14(A)).

Then, impurity ions, or phosphorus ions, are implanted into the island silicon regions of TFTs by a self-aligning ion doping process (also known as a plasma doping process) while using the gate electrodes as a mask. Phosphine (PH$_3$) is used as doping gas. The dose is 2 to 8×10$^{15}$ ions/cm$^2$ (FIG. 14(B)).

The silicon oxide film 603 acting as a base layer is etched. The etching is terminated by the aluminum nitride film 602 acting as a stopper. Under this condition, the laminate is irradiated with KrF excimer laser radiation having a wavelength of 248 nm and a pulse width of 20 nsec to improve the crystallinity of the silicon film, which deteriorates due to ion doping. The energy density of the laser radiation is 100 to 400 mJ/cm$^2$, preferably 100 to 150 mJ/cm$^2$. Since a silicon oxide film containing phosphorus or boron absorbs ultraviolet radiation, where laser annealing is conducted subsequent to through-doping as in Example 8, intense laser light is needed. In the present example, however, if the silicon oxide film, or gate-insulating film, is removed after doping, less laser energy suffices. This can improve the throughput of the laser processing. In this way, N-type phosphorus-doped regions 608 and 609 are formed. The sheet resistance of these regions is 200 to 800 Ω/cm$^2$ (FIG. 14(C)).

Then, silicon oxide is deposited as an interlayer insulator 610 having a thickness of 2000 to 3000 Å over the entire surface by plasma CVD, LPCVD, or atmospheric pressure CVD. An aluminum film having a thickness of 2000 Å to 5 μm is formed as a wiring layer material. This aluminum is photolithographically patterned to form wiring layers 611 and 612 connected with the source and drain of a TFT. As shown, the wiring layer 612 crosses the wiring layer 607 (FIG. 14(C)).

Finally, the laminate processed in this way is annealed in a hydrogen at 350° C. for 30 minutes at 1 atm., thus completing hydrogenation of the laminate. In this way, a TFT is completed. At the same time, the doped region is doped with boron to fabricate a P-channel TFT. A CMOS is fabricated. Typical field mobilities of the N-channel and P-channel types are 80 to 150 cm$^2$/Vs and 40 to 100 cm$^2$/Vs, respectively. We have confirmed that a shift register constructed from these TFTs operated at 11 MHz when the drain voltage was 17 V.

Although a high voltage exceeding 20 V is applied to the gate and the drain for a long time (about 96 hours), the characteristics deteriorate only slightly. This is because heat generated locally in the TFTs is quickly dissipated, suppressing liberation of hydrogen atoms from the interface with the semiconductor coating and from the interface with the gate-insulating film.

EXAMPLE 11

An active-matrix circuit is formed on a soda-lime glass substrate 201 by the steps illustrated in FIGS. 2(A)–2(E). An insulating film 202 having a higher thermal conductivity than that of silicon oxide 203 is formed over the whole surface of the substrate 201. In the present example, the film 202 is made of aluminum nitride. The aluminum nitride film is formed by sputtering under the same conditions as in Example 8.

Figure 2E:
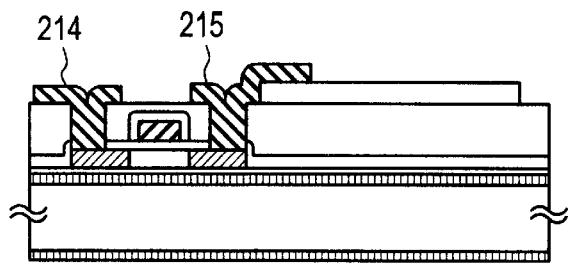

Then, a silicon oxide film 203 forming a base layer is formed in the same way as in Example 2. Subsequently, a TFT illustrated in FIG. 2(E) is formed by performing steps similar to the steps of Example 2.

EXAMPLE 12

Figure 15A:
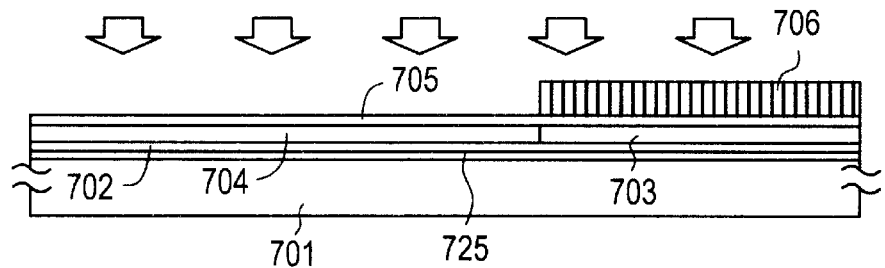
FIG. 15, (A)–(D), are cross-sectional views illustrating a still additional method of fabricating a TFT according to the invention.
Figure 15B:
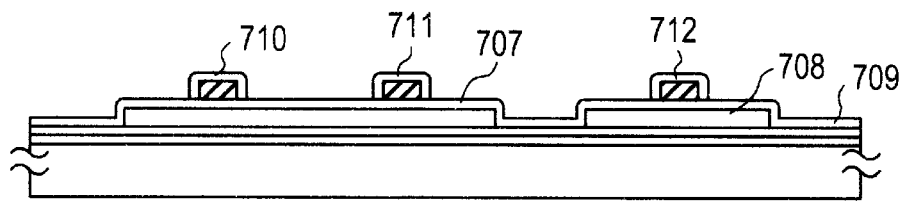
Figure 15C:
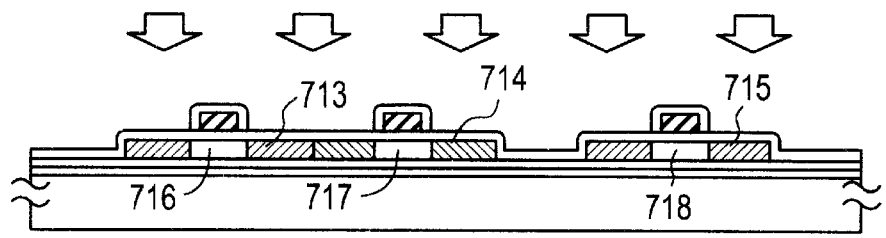
Figure 15D:
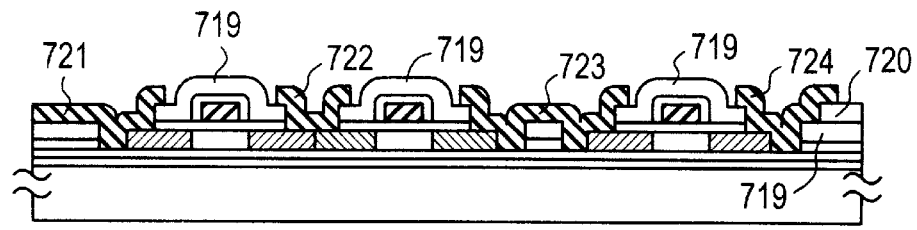

A laser-crystallized silicon TFT for forming a peripheral circuit and an amorphous silicon TFT for an active-matrix circuit are formed on a substrate 701 of Corning 7059 by the steps illustrated in FIGS. 15(A)–15(D). An insulating film 725 having a higher thermal conductivity than the silicon oxide 702 is formed on the substrate 701. In the present example, the film 725 is made of transparent aluminum nitride. This aluminum nitride film 725 is formed by sputtering under the same conditions as in Example 8. Subsequently, a silicon oxide film 702 forming a base layer is deposited to a thickness of 20 to 200 nm. Thereafter, steps similar to the steps of Example 4 were carried out to form a TFT (thin film transistor) on the silicon oxide film 702 as shown in FIG. 15(D).

EXAMPLE 13

Figure 16A:
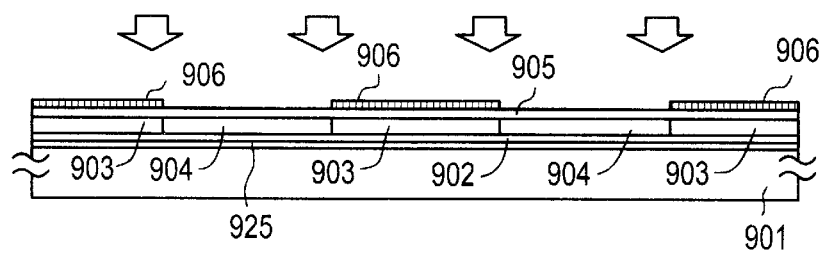
FIG. 16, (A)–(E), are cross-sectional views illustrating a still further method of fabricating a TFT according to the invention.
Figure 16B:
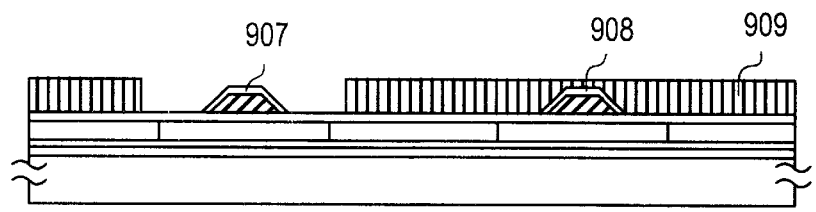
Figure 16C:
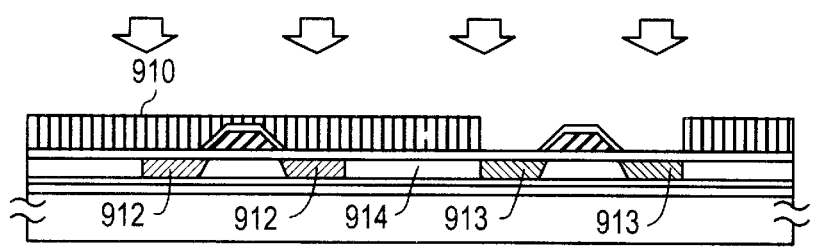
Figure 16D:
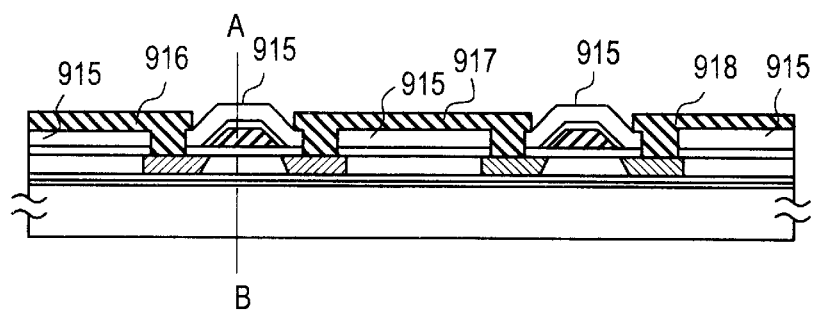
Figure 16E:
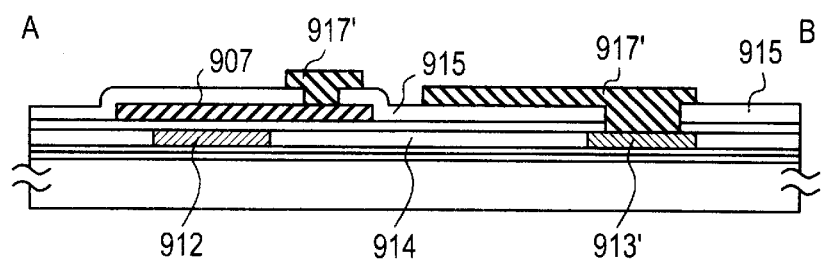

A TFT is formed by the steps shown in FIGS. 16(A)–16(E). An insulating film 925 having a higher thermal conductivity than silicon oxide 902 is formed on an insulating substrate 901. In the present example, the film 925 is made of aluminum nitride. This aluminum nitride film 925 is formed by sputtering under the same conditions as in Example 8. A silicon oxide film 902 forming a base layer is then formed. Subsequently, steps similar to the steps of Example 6 are effected to form a TFT as shown in FIG. 16(E).

EXAMPLE 14

Figure 17A:
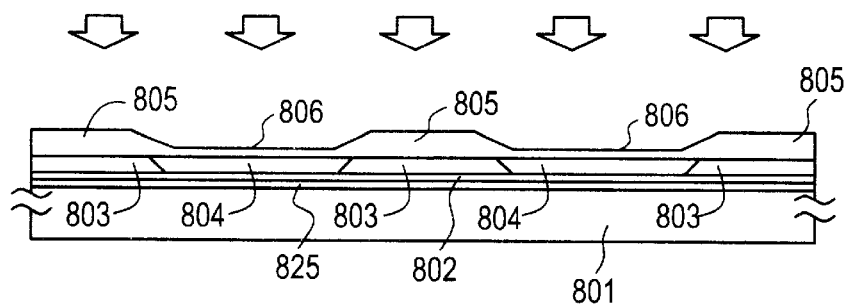
FIG. 17, (A)–(E), are cross-sectional views illustrating yet another method of fabricating a TFT according to the invention.
Figure 17B:
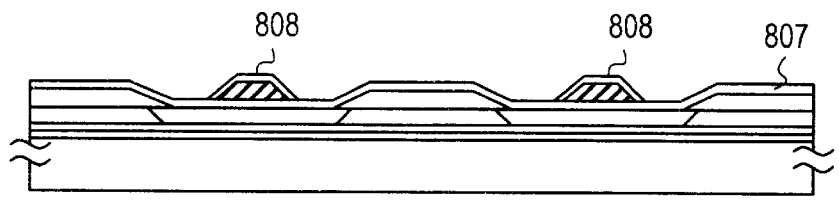
Figure 17C:
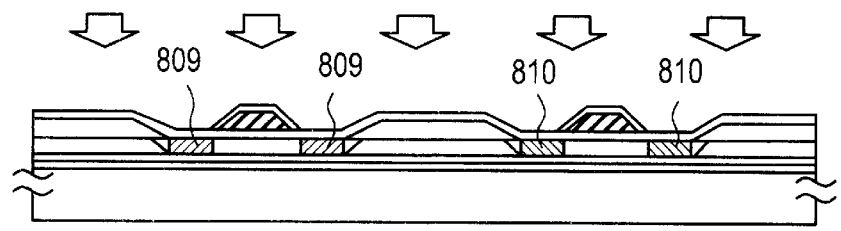
Figure 17D:
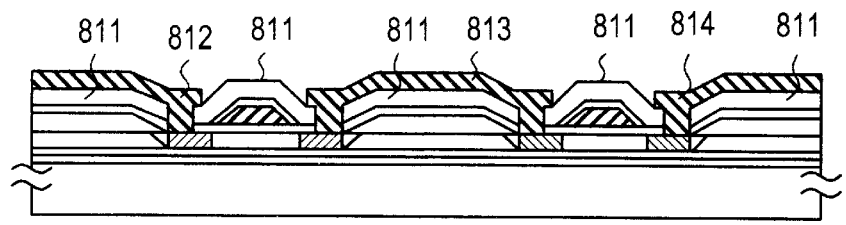
Figure 17E:
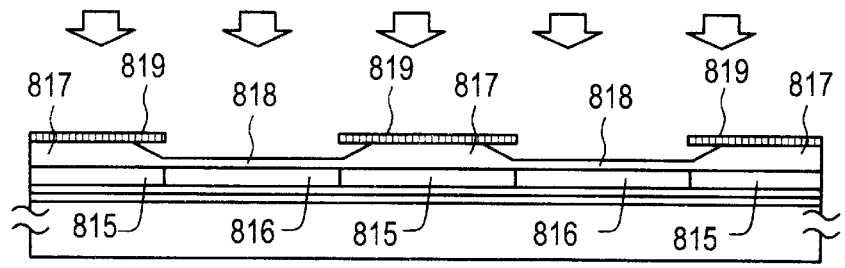

A TFT is formed by the steps illustrated in FIGS. 17(A)–17(E). An insulating film 825 having a higher thermal conductivity than silicon oxide 802 is formed on an insulating substrate 801. In the present example, the film 825 is made of aluminum nitride. This aluminum nitride film 825 is formed by sputtering under the same conditions as in Example 8. A silicon oxide film 802 forming a base layer is then formed. Subsequently, steps similar to the steps of Example 5 are effected to form a TFT as shown in FIG. 17(D).

The present invention permits fabrication of a TFT which shows high reliability even if a voltage is applied for a long time. In this way, the present invention is industrially very advantageous. Especially, where TFTs are formed on a substrate having a large area and used as an active-matrix circuit or as a driver circuit, great industrial advantages can be attained.

In accordance with the present invention, TFTs can be manufactured at low temperatures with a quite high production yield. Various LCD structures can be produced according to the invention as described in the above examples, because characteristics required by TFTs can be set at will in the present invention.

Although not described in the above examples, the invention can be applied to a three-dimensional IC structure where a semiconductor circuit is built on a single-crystal IC or the like. The above-described examples principally pertain to the use of the invention in various LCDs. Obviously, the invention may also be utilized in other circuits which are required to be formed on an insulating substrate such as an image sensor.

What is claimed is:

1. A method for forming a semiconductor device comprising the steps of:

forming an amorphous semiconductor film comprising silicon on an insulating surface;

forming an insulating film on said amorphous semiconductor film;

selectively etching said insulating film to obtain a region having thinned therefrom said insulating film;

irradiating a laser light to said amorphous semiconductor film to heighten a crystallinity thereof under said region;

forming a gate electrode on said insulating film;

selectively implanting at least one impurity into said amorphous semiconductor film with said gate electrode and a portion of said insulating film other than said region as masks; and irradiating a laser light to a region into which said at least one impurity is implanted to activate said region into which said at least one impurity is implanted.

2. The method of claim 1 wherein said at least one impurity is of an N-type, a P-type or both thereof.

3. The method of claim 1 wherein said amorphous semiconductor film has a resistivity of $10^9$ Ωcm or more.

4. A method for forming a semiconductor device comprising the steps of:

forming an amorphous semiconductor film comprising silicon over a substrate;

forming an insulating film on said amorphous semiconductor film, said insulating film having at least a first region having a first thickness and a second region having a second thickness larger than said first thickness; and irradiating an entire surface of said insulating film with a laser light so that a first portion of said amorphous semiconductor film located under said first region of the insulating film is crystallized while a second portion of said amorphous semiconductor film located under said second region of the insulating film is not crystallized.

5. The method of claim 4 wherein said insulating film comprises silicon oxide.

6. A method for forming a semiconductor device comprising the steps of:

forming an amorphous semiconductor film comprising silicon over a substrate;

forming an insulating film on said amorphous semiconductor film;

selectively etching said insulating film so that said insulating film has a first region having a first thickness and a second region having a second thickness larger than said first thickness; and irradiating an entire surface of said insulating film with a laser light so that a first portion of said amorphous semiconductor film located under said first region of the insulating film is crystallized while a second portion of said amorphous semiconductor film located under said second region of the insulating film is not crystallized.

7. The method of claim 4 wherein said insulating film comprises silicon oxide.

8. The method of claim 4 wherein said etching is performed by isotropic etching.

9. The method of claim 4 wherein said insulating film has a sloped surface at a boundary between said first and second regions.

* * * * *